(12) United States Patent
Wang et al.

(10) Patent No.: US 12,374,609 B2
(45) Date of Patent: Jul. 29, 2025

(54) INTEGRATED CIRCUIT PACKAGE STRUCTURE WITH CONDUCTIVE STAIR STRUCTURE

(71) Applicant: NANYA TECHNOLOGY CORPORATION, New Taipei (TW)

(72) Inventors: Chien-Chung Wang, New Taipei (TW); Hsih-Yang Chiu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/631,072

(22) Filed: Apr. 10, 2024

(65) Prior Publication Data

US 2024/0258220 A1 Aug. 1, 2024

Related U.S. Application Data

(60) Continuation of application No. 18/305,374, filed on Apr. 23, 2023, now Pat. No. 11,984,389, which is a division of application No. 17/324,101, filed on May 18, 2021, now Pat. No. 11,676,886.

(51) Int. Cl.
*H01L 23/00* (2006.01)
*H01L 21/48* (2006.01)
*H01L 23/498* (2006.01)

(52) U.S. Cl.
CPC .... *H01L 23/49811* (2013.01); *H01L 21/4853* (2013.01); *H01L 24/48* (2013.01); *H01L 2224/48225* (2013.01); *H01L 2924/1533* (2013.01)

(58) Field of Classification Search
CPC .......... H01L 23/49811; H01L 21/4853; H01L 24/48; H01L 2224/48225; H01L 2924/1533
See application file for complete search history.

(56) References Cited

U.S. PATENT DOCUMENTS

| | | | |
|---|---|---|---|
| 6,090,237 A | 7/2000 | Reynolds et al. | |
| 10,504,838 B2 | 12/2019 | Sorensen et al. | |
| 2011/0244666 A1 | 10/2011 | Kim et al. | |
| 2012/0306089 A1 | 12/2012 | Freeman et al. | |
| 2017/0162554 A1 | 6/2017 | Clevenger et al. | |
| 2017/0243816 A1* | 8/2017 | Kwark | H01L 21/481 |

* cited by examiner

*Primary Examiner* — Elias Ullah
(74) *Attorney, Agent, or Firm* — CKC & Partners Co., LLC

(57) ABSTRACT

An integrated circuit package structure includes a circuit board, an integrated circuit die and a conductive stair structure. The circuit has an upper surface. The integrated circuit die is located on the upper surface of the circuit board. The conductive stair structure is located on the upper surface of the circuit board. The conductive stair structure includes steps along a first direction substantially perpendicular to the upper surface of the circuit board. The steps have different heights relative to the upper surface of the circuit board.

19 Claims, 21 Drawing Sheets

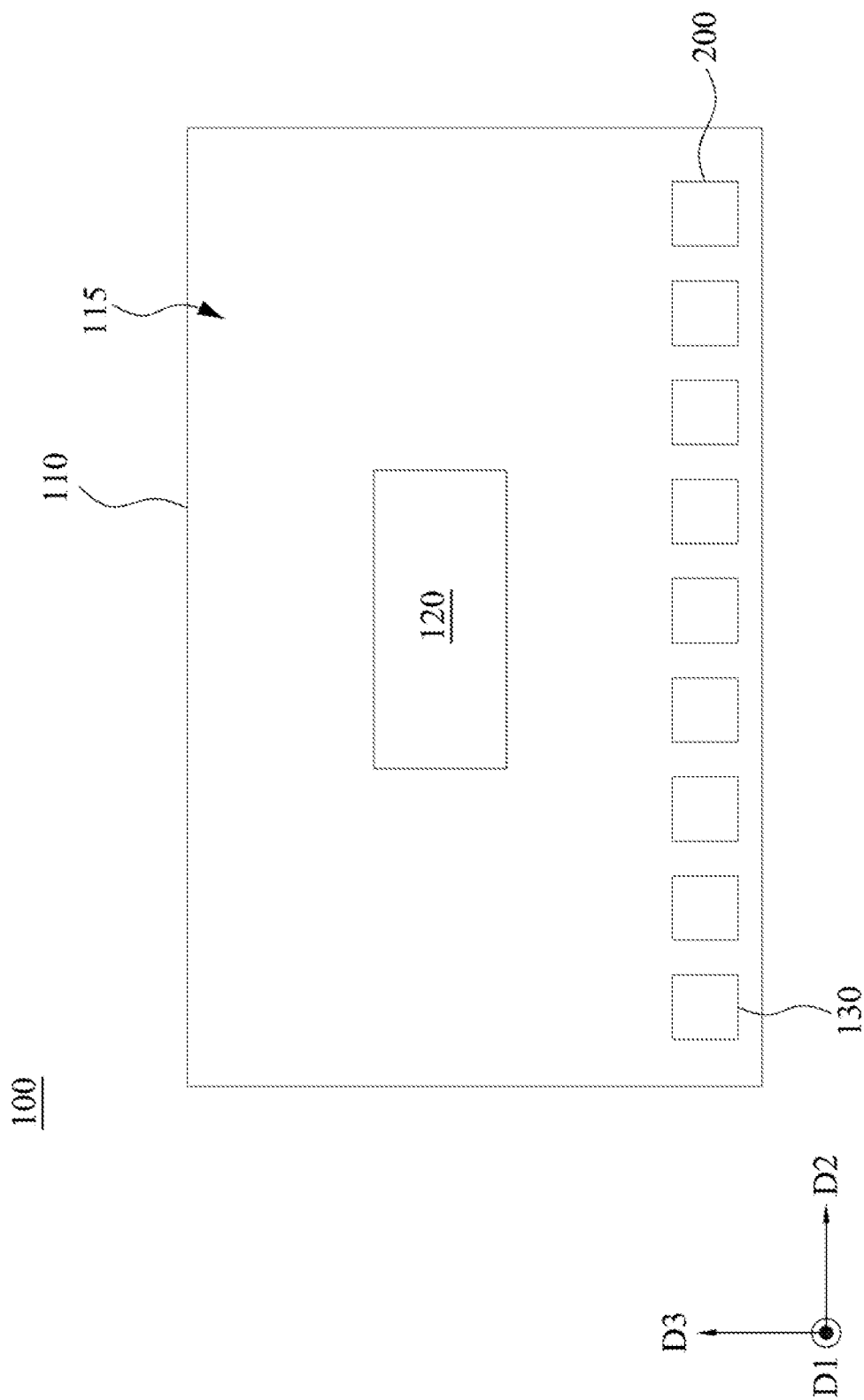

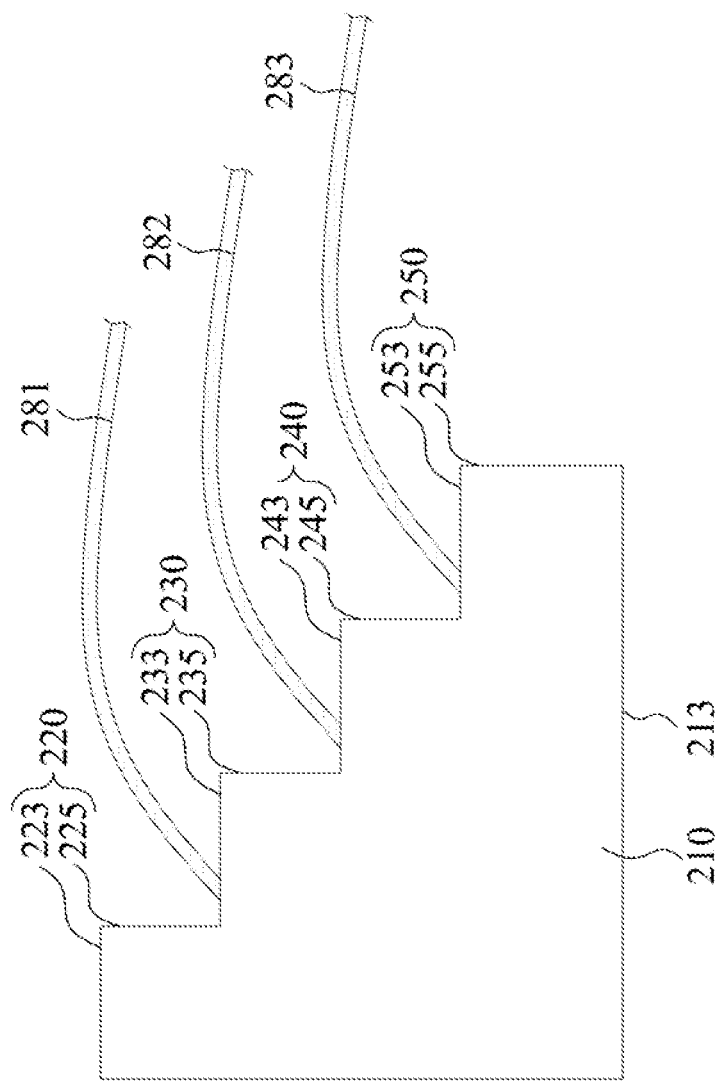
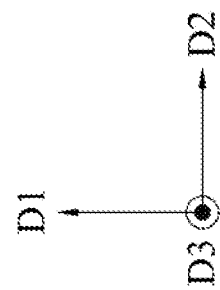
Fig. 2B

INTEGRATED CIRCUIT PACKAGE STRUCTURE WITH CONDUCTIVE STAIR STRUCTURE

CROSS-REFERENCE TO RELATED APPLICATIONS

This application is a Continuation application of the U.S. application Ser. No. 18/305,374, filed on Apr. 23, 2023, which is a Divisional application of the U.S. application Ser. No. 17/324,101 filed on May 18, 2021, now U.S. Pat. No. 11,676,886, issued Jun. 13, 2023, all of which are herein incorporated by reference in their entirety.

BACKGROUND

Field of Invention

The present disclosure relates to an integrated circuit package structure with a conductive stair structure and a method of manufacturing thereof.

Description of Related Art

For a package structure, one or more bonding pads of the package structure can be used to be connected to other package structures by bonding wires. However, it is difficult to connect to two or more package structures in one bonding pad on the package structure by wire bonding and copper pillar bonding simultaneously, so that the area of the package structure is occupied.

Therefore, how to provide a solution for connect two or more bonding wires to one bonding structure of the package structure is one of the subjects to be solved for the industry.

SUMMARY

One aspect of the present disclosure is relative to an integrated circuit package structure.

According to one embodiment of the present disclosure, an integrated circuit package structure includes a circuit board, an integrated circuit die and a conductive stair structure. The circuit has an upper surface. The integrated circuit die is located on the upper surface of the circuit board. The conductive stair structure is located on the upper surface of the circuit board. The conductive stair structure includes steps along a first direction substantially perpendicular to the upper surface of the circuit board. The steps have different heights relative to the upper surface of the circuit board.

In one or more embodiments of the present disclosure, the integrated circuit package structure further includes a seed layer and a buffer connector. The seed layer covers the steps of the conductive stair structure. The buffer connector is formed on the seed layer and located between two immediately-adjacent ones of the steps.

In one or more embodiments of the present disclosure, each of the steps of the conductive stair structure includes a sidewall and a plane. The sidewall of each step is extended along the first direction. The plane of each step is extended parallel to the upper surface of the circuit board. The plane abuts the sidewall.

In some embodiments, the integrated circuit package structure includes a plurality of bonding wires. The bonding wires are configured to connect a plurality of dies structure to the steps of the conductive stair structure.

In some embodiments, the steps include a first step and a second step. A height of the plane of the first step is greater than a height of the plane of the second steps along the first direction. The sidewall of the first step abuts the plane of the second step.

In some embodiments, the integrated circuit package structure further includes a seed layer and a buffer connector. The planes and the sidewalls of the first and second steps are covered by the seed layer. The buffer connector is located on the plane of the second step and abutting the sidewall of the first step. The buffer connector is extended beyond an edge defined by an interface between the plane and the sidewall of the first step and an interface between the plane and the sidewall of the second step.

In some embodiments, the buffer connector includes a cylindrical surface protruding from the edges of planes of the first and second steps.

In some embodiments, the integrated circuit package structure further includes a conductive bump and a bonding wire. The conductive bump is located on the cylindrical surface. The bonding wire is extended from the conductive bump and connected to a die structure.

In some embodiments, the integrated circuit package structure further includes a conductive rod. The conductive rod is located on the plane of the one with the greatest height of the steps. The conductive rod is extended along the first direction and configured to be connected to a conductive pad upon the conductive stair structure along the first direction.

In some embodiments, a top of the conductive rod includes a flat plane. The flat plane is configured to be directly contact with the conductive pad upon the conductive stair structure.

One aspect of the present disclosure is relative to a method of manufacturing an integrated circuit package structure.

According to one embodiment of the present disclosure, the method of manufacturing the integrated circuit package structure includes following operations. A circuit board with an integrated circuit die is provided. A conductive material is positioned on an upper surface of the circuit board. A photo-resist layer is formed on a first portion of the conductive material. The conductive material is etched according to the photo-resist layer to recess the conductive material beyond the first portion. The photo-resist layer is removed to expose the first portion as a first step.

In one or more embodiments of the present disclosure, the method further includes following operations. A first spacer layer is formed before the photo-resist layer is removed, and the photo-resist layer and the conductive material beyond the first portion are covered by the first spacer layer. The first spacer layer is etched to define a second portion covered by the etched first spacer layer and expose the conductive material beyond the first and second portions. The conductive material beyond the first and second portions is recessed. The first spacer layer is removed to expose the second portion as a second step.

In some embodiments, the method further includes following operations. A second spacer layer is formed before the first spacer layer is removed, and the photo-resist layer, the first spacer layer and the conductive material beyond the first and second portions is covered by the second spacer layer. The second spacer layer is etched to define a third portion covered by the etched second spacer layer and expose the conductive material beyond the first, second and third portions. The conductive material beyond the first, second and third portions is recessed. The second spacer layer is removed to expose the third portion as a third step.

In some embodiments, the method further includes following operations. A seed layer is formed after the photo-resist layer is removed, and the first and second steps are covered by the seed layer. A buffer connector is formed on the seed layer between the first and second steps. A conductive bump is formed on the buffer connector and a conductive line extended from the conductive bump.

In one or more embodiments of the present disclosure, the method further includes following operations. A seed layer is formed after the photo-resist layer is removed, and the first step is covered by the seed layer. A masking layer is formed on the seed layer. An opening is formed within the masking layer. The opening is aligned with the first portion. A conductive rod is filled with the opening. The masking layer is removed.

In summary, an integrated circuit package structure can have a conductive stair structure with a greater area used to be connected bonding wire than a flat conventional conductive pad, and space occupied by the conventional conductive pads on the integrated circuit package structure can be reduced.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

FIG. 1 illustrates a schematic top view of an integrated circuit package structure according to one embodiment of the present disclosure;

FIGS. 2A-2D illustrate conductive stair structures according to embodiments of the present disclosure;

DETAILED DESCRIPTION

Figure 2A:
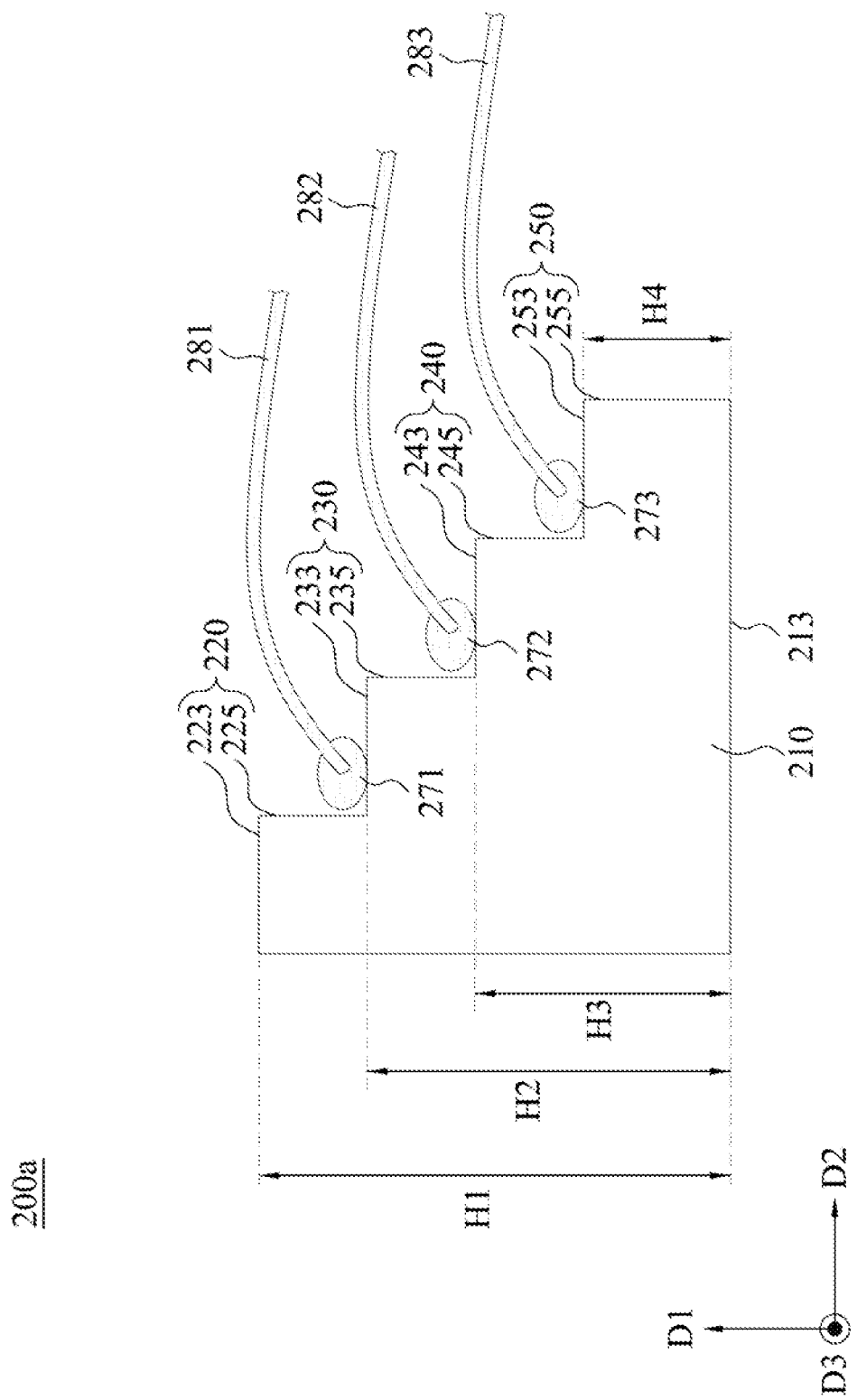

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

One or more bonding wires are used for connections of die-to-die or package-to-package. In some cases, a die package is configured to be connected to two or more die packages simultaneously, and the two or more bonding pads are used to be connected between the die package and other die packages, thereby occupying many areas on the die package. In some embodiments of the present disclosure, conductive pads connected to different bonding wires on the die package structure can be replaced by one conductive stair structure, which has a three-dimension structure to have a great area used to be connected.

Reference is made by FIG. 1. FIG. 1 illustrates a schematic top view of an integrated circuit package structure 100 according to one embodiment of the present disclosure.

As shown in FIG. 1, in this embodiment, an integrated circuit package structure 100 includes a circuit board 110, an integrated circuit die 120 and bonding pads 130. The circuit board 110 includes an upper surface 115. In this embodiment, the integrated circuit die 120 and the bonding pads 130 are located on the upper surface 115 of the circuit board 110.

In some embodiments, the integrated circuit die 120 is connected to the bonding pads 130 by circuit within the circuit board 110 (not shown in figures). In some embodiments, the integrated circuit package structure 100 can be regarded as a chip package, and the integrated circuit die 120 can be regarded as a formed die including integrated circuits, and the bonding pads 130 located on the upper surface 115 of the circuit board 110 can be connected to different pins of the integrated circuit die 120. In some embodiments, the integrated circuit die 120 includes integrated circuits or memories. In some embodiments, the integrated circuit die 120 can be regarded as an integrated circuit package.

In the embodiments of the present disclosure, one or more bonding pads 130 located on the upper surface 115 of the circuit board 110 can be replaced by a conductive stair structure 200, which has a great area used to be connected. In this embodiment, the replacing conductive stair structure 200 is located adjacent an edge of the circuit board 110. The conductive stair structure 200 can be connected to a pin of the integrated circuit die 120 through circuits within the circuit board 110.

Specifically, in this embodiment, the conductive stair structure 200 has a thickness greater than the bonding pads 130 along a first direction D1 out of the paper. The upper surface 115 of the circuit board 110 is extended along a second direction D2 and a third direction D3, which are perpendicular to the first direction D1. In such case, areas used to be connected can be arranged along a sloped direction extending upward the upper surface 115 for the conductive stair structure 200.

To further describe detailed structure of the conductive stair structure 200, please refer to FIGS. 2A-2D. FIGS. 2A-2D illustrate conductive stair structures 200a, 200b, 200c and 200d according to embodiments of the present disclosure. For the purpose of simple description, the circuit board 110 is not shown in figures. Any of the conductive stair structures 200a, 200b, 200c and 200d can be used as the conductive stair structure 200 in FIG. 1.

FIG. 2A schematically illustrates a cross-section view of the conductive stair structure 200a along the first direction D1 and the second direction D2. As shown in FIG. 2A, the conductive stair structure 200a includes a conductive material 210 and steps 220, 230, 240 and 250 formed on the conductive material 210. The steps 220, 230, 240 and 250 are arranged along the first direction D1 substantially perpendicular to the upper surface 115 of the circuit board 110. The steps 220, 230, 240 and 250 have different heights relative to the upper surface 115 of the circuit board 110.

In some embodiments, conductive material 210 of the conductive stair structure 200a includes metal. In some embodiments, conductive material 210 of the conductive stair structure 200a includes copper.

In this embodiment, each of the steps 220, 230, 240 and 250 includes a plane along the second direction D2 and a sidewall along the first direction. In other words, the planes of the steps 220, 230, 240 and 250 are parallel to the upper surface 115 of the circuit board 110.

Specifically, in this embodiment, the step 220 has a plane 223 along the second direction D2 and parallel to the upper surface 115 and a sidewall 225 along the first direction D1. The sidewall 225 abuts the plane 223 to have a right angle. Similarly, the step 230 has a plane 233 and a sidewall 235, the step 240 has a plane 243 and a sidewall 245, and the step 250 has a plane 253 and a sidewall 255.

In this embodiment, the heights of the steps 220, 230, 240 and 250 can be defined by lengths from a bottom 213 of the conductive material 210 to the corresponding planes 223, 233, 243 and 253. A height H1 of the step 220 is a length from the bottom 213 to the plane 223 along the first direction D1. A height H2 of the step 230 is a length from the bottom 213 to the plane 233 along the first direction D1. A height H3 of the step 240 is a length from the bottom 213 to the plane 243 along the first direction D1. A height H4 of the step 250 is a length from the bottom 213 to the plane 253 along the first direction D1. Therefore, the height H1 of the step 220 is greater than the height H2 of the step 230 along the first direction D1, the height H2 of the step 230 is greater than the height H3 of the step 240 along the first direction D1, and the height H3 of the step 240 is greater than the height H4 of the step 250 along the first direction D1. The step 230 has the greatest height H1 of the heights H2, H3 and H4.

As shown in FIG. 2, two immediately-adjacent ones of the steps 220, 230, 240 and 250 are abutted from each other. For the two immediately-adjacent steps 220, 230, the sidewall 225 of steps 220 abuts the higher plane 223 of the step 220 and the lower plane 233 of the step 230. Similarly, the sidewall 235 abuts the plane 233 of the step 230 and the plane 243 of the step 240, and the sidewall 245 abuts the plane 243 of the step 240 and the plane 253 of the step 250. Therefore, the steps 220, 230, 240 and 250 are arranged along a sloped direction extending upward the bottom 213 to form the conductive stair structure 200a.

Compared with conventional bonding pad, additional spaces are introduced by the sidewalls 225, 235, 245 and 255 of the steps 220, 230, 240 and 250. Therefore, numbers of the bonding wires connected to the conductive stair structure 200 can be greater than one. The bonding wires connected to the conductive stair structure 200 can be extended to the additional spaces introduced by the sidewalls 225, 235, 245 and 255 of the steps 220, 230, 240 and 250.

As shown in FIG. 2A, conductive bumps 271, 272 and 273 are provided and respectively located between two immediately-adjacent ones of the steps 220, 230, 240 and 250. The conductive bumps 271, 272 and 273 are respectively positioned on the planes 233, 243 and 243. Further, bonding wires 281, 282 and 283 are provided and respectively extended from the conductive bumps 271, 272 and 273 and away from the steps 220, 230, 240 and 250 formed on the conductive material 210. The bonding wires 281, 282 and 283 are used to be connected to other die packages beyond the integrated circuit package structure 100. In some embodiments, a bonding bump and a boding wire can be also formed on the plane 223 of the step 220.

Reference is made by FIG. 2B. FIG. 2B illustrates a cross-section view of a conductive stair structure 200b according to one embodiment of the present disclosure.

With respect to the conductive stair structure 200a in FIG. 2A, there is no conductive bump in the conductive stair conductive stair structure 200b in FIG. 2B. Therefore, the bonding wires 281, 282 and 283 are directly extended to the planes 233, 243 and 253, respectively. In some embodiments, a boding wire can be also directly formed on the plane 223 of the step 220.

Figure 2C:
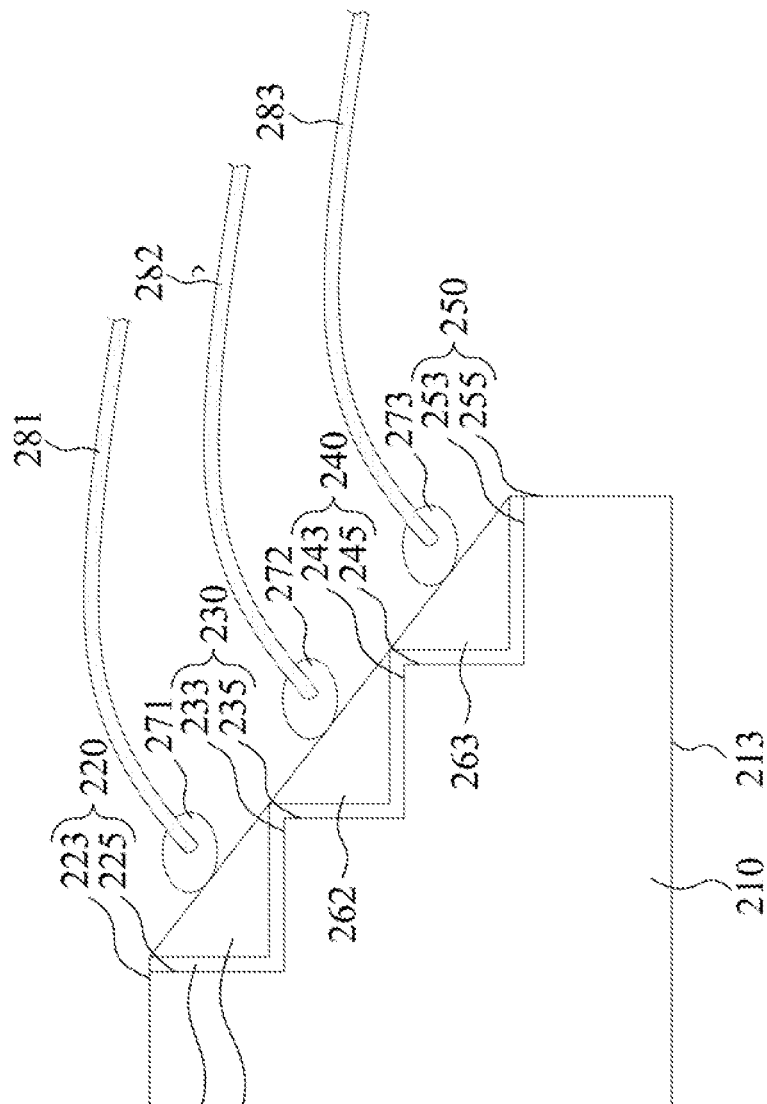

Reference is made by FIG. 2C. FIG. 2C illustrates a cross-section view of a conductive stair structure 200c according to one embodiment of the present disclosure.

With respect to the conductive stair structure 200a in FIG. 2A, the conductive stair structure 200c in FIG. 2C further includes a seed layer 260 and buffer connectors 261, 262 and 263 on the seed layer 260.

Specifically, the sidewall 225 of the step 220, the plane 233 and the sidewall 235 of the step 230, the plane 243 and the sidewall 245 of the step 240 and the plane 253 of the step 250 are covered by the seed layer 260. The seed layer 260 is used to form metal connectors on the steps 220, 230, 240 and 250. In some embodiments, the conductive bumps 271, 272 and 273 can be directly formed on the seed layer 260. In some embodiments, material of the seed layer 260 includes metal, which can be formed on the steps 220, 230, 240 and 250 by a depositing process.

Return to FIG. 2C. In this embodiment, buffer connectors 261, 262 and 263 are formed between the seed layer 260 and the conductive bumps 271, 272 and 273, respectively. In details, the conductive bumps 271 is filled with the additional space introduced by the sidewall 225 and connect an edge of the plane 223 and an edge of the plane 233 to form a sloped surface in which the conductive bump 271 can be located on. In some embodiments, a boding wire can be directly formed on the plane 223 of the step 220. Obviously, a sum of the areas of the sloped surfaces of the buffer connectors 261, 262 and 263 and an area of the plane 223 is greater than the area on the bottom 213 of the conductive material 210, so that the plurality of the bonding wires 281, 282 and 283 can be connected to the same conductive stair structure 200c at the same time.

Figure 2D:
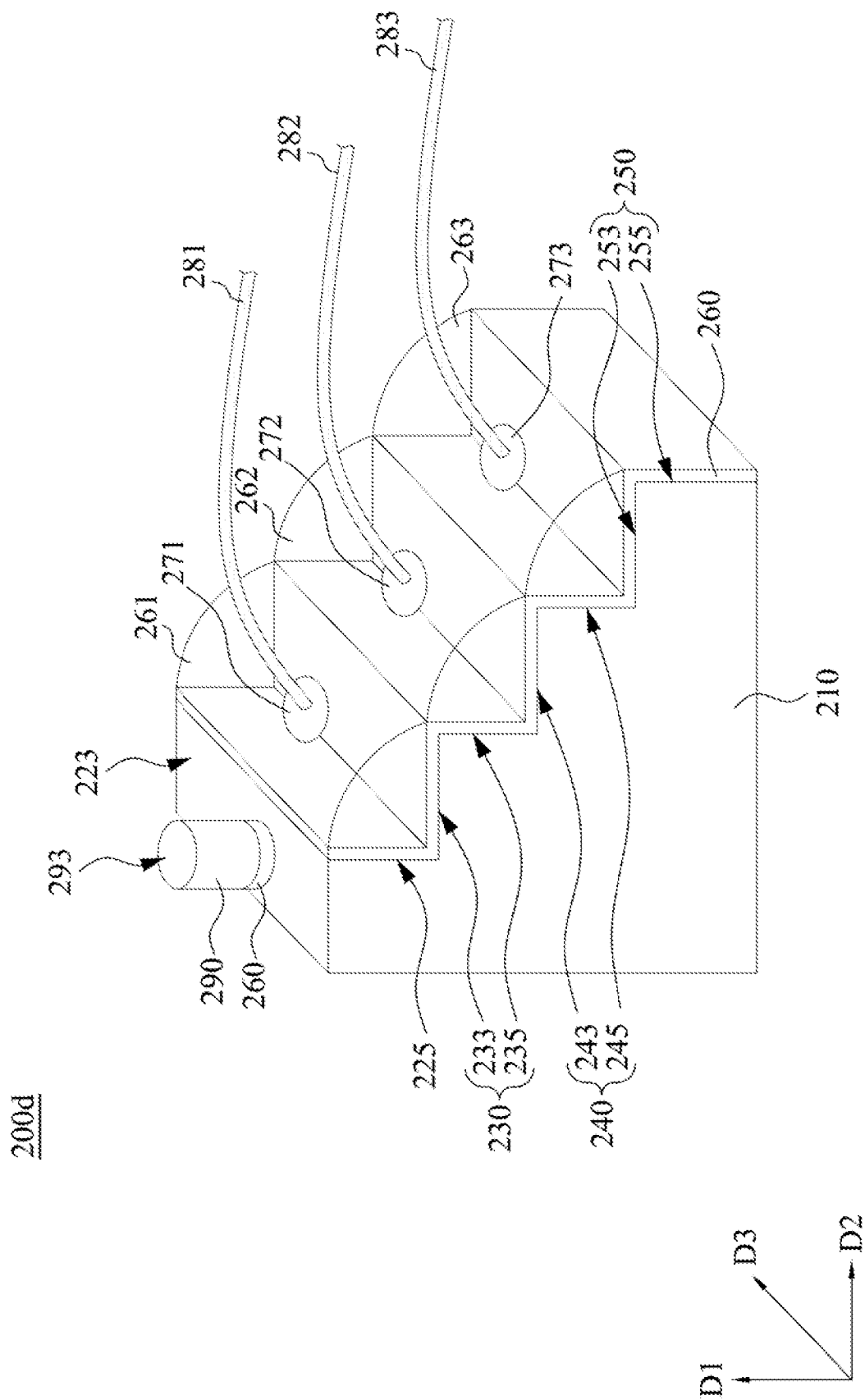

Reference is made by FIG. 2D. FIG. 2D illustrates a schematic perspective view of a conductive stair structure 200d according to one embodiment of the present disclosure.

A difference between the conductive stair structure 200d in FIG. 2D and the conductive stair structure 200c in FIG. 2C is that each of the buffer connectors 261, 262 and 263 has a cylindrical surface, which is beyond the sloped surface connecting the edges of the plane of two immediately-adjacent ones of the steps. Each of the cylindrical surfaces of the buffer connectors 261, 262 and 263 has a greater area than an area of each sloped surface connecting the edges of the plane of two immediately-adjacent ones of the steps 220, 230, 240 and 250. In this way, areas to be connected to the conductive bumps 271, 272 and 273 and/or bonding wires 281, 282 and 283 are further increased for the conductive stair structure 200d.

Further, compared with the conductive stair structure 200c, the conductive stair structure 200d includes a conductive rod 290, which is located on a small region of the seed layer 260. The conductive rod 290 is located on the plane 223 of the step 220, which is the highest one of the steps 220, 230, 240 and 250. The conductive rod 290 can be used to be connected to another die upon the conductive stair structure 200d. In this embodiment, the conductive rod 290 includes a flat plane 293, so that the die package upon the conductive stair structure 200d can be directly contact with the flat surface 293 of the conductive rod 290.

In additional, compared with the conductive stair structure 200c, the sidewall of the step 250 is further covered by the seed layer 260 of the conductive stair structure 200d since the buffer connector 263 extends beyond the edge of the plane 253 and cover the seed layer 260 on the sidewall 255. In details, please refer to the following discussion.

Figure 3:
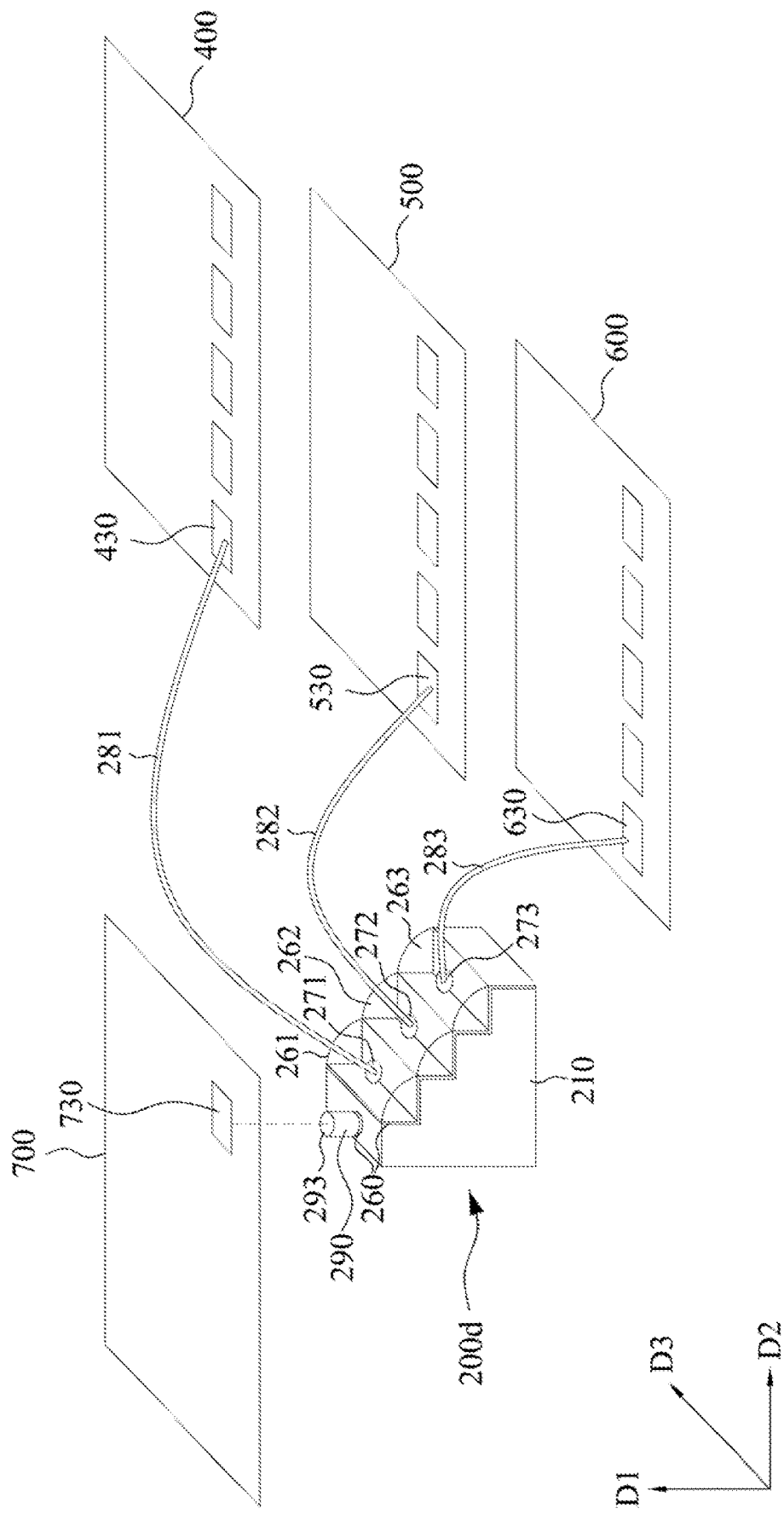
FIG. 3 illustrates a schematic view of a connections between the conductive stair structure and other die packages according to one embodiment of the present disclosure.

Reference is made by FIG. 3. FIG. 3 illustrates a schematic view of connections between the conductive stair structure 200d and other die packages 400, 500, 600 and 700 according to one embodiment of the present disclosure. It should be noted that the sizes of the conductive stair structure 200d and the die packages 400, 500, 600 and 700 are just for illustrations but not intended to limit the present disclosure.

In FIG. 3, the die packages 400, 500 and 600 are basically at the same height as the conductive stair structure 200d, and the die package 700 is located upon the conductive stair structure 200d. In this embodiment, the die package 400 includes a conductive pad 430. The die package 500 includes a conductive pad 530. The die package 600 includes a conductive pad 630. The die package 700 includes a conductive pad 730, which is located upon and aligned with the flat plane 293 of the conductive rod 290 on the plane 223 of the step 220.

The bonding wires 281, 282 and 283 extended from the different buffer connectors 261, 262 and 263 with different heights are used to be connected to different die packages 400, 500 and 600. As shown in FIG. 3, in this embodiment, the bonding wire 281 is used to connect the conductive pad 430 of the die package 400 and the conductive bump 271 on the conductive stair structure 200d, the bonding wire 282 is used to connect the conductive pad 530 of the die package 600 and the conductive bump 272 on the conductive stair structure 200d, and the bonding wire 283 is used to connect the conductive pad 630 of the die package 600 and the conductive bump 273 on the conductive stair structure 200d. As mentioned above, the conductive bumps 271, 272 and 273 are respectively located on the steps 230, 240 and 250, which are with different heights. In this embodiment, all of the bonding wires 281, 282 and 283, which are respectively connected to different die packages 400, 500 and 600, can be connected to one conductive stair structure 200d.

Further, as shown in FIG. 3, the conductive pad 730 of the die package 700 is located upon and aligned with the conductive rod 290 (dash line as shown in FIG. 3). In some embodiment, the conductive pad 730 can be directly connected to the flat plane 293 of the conductive rod 290.

Therefore, in this embodiment, one conductive stair structure 200d with four steps 220, 230, 240 and 250 with different heights along the first direction D1 can be used to be connected to four different die packages 400, 500, 600 and 700.

Figure 4:
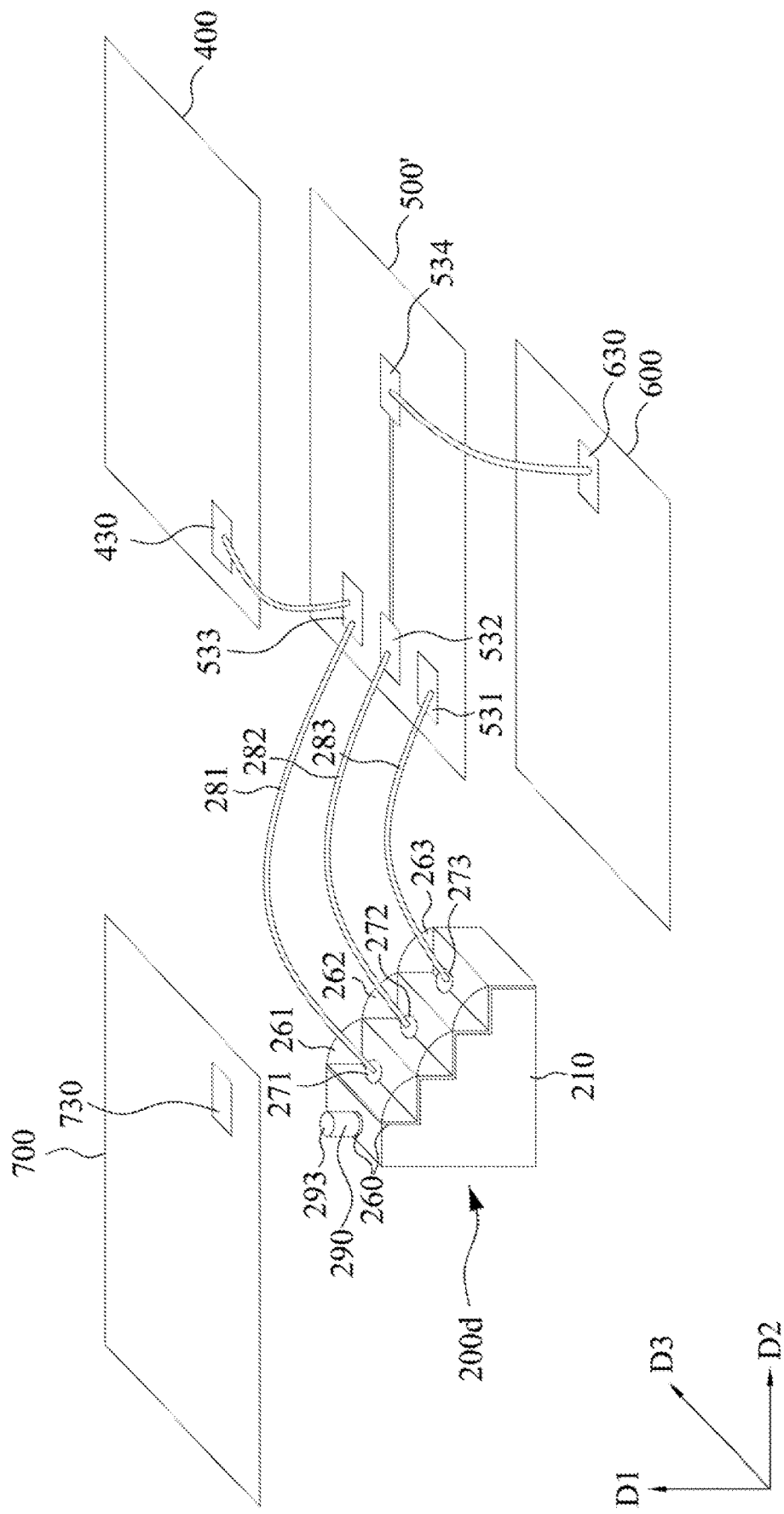
FIG. 4 illustrates a schematic view of a connections between the conductive stair structure and other die packages according to one embodiment of the present disclosure.

FIG. 4 illustrates a schematic view of connections between the conductive stair structure 200d and other die packages 400, 500', 600 and 700 according to one embodiment of the present disclosure.

Compared with FIG. 3, the die package 500' shown in FIG. 4 includes four conductive pads 531, 532, 533 and 534, and the bonding wires 281, 282 and 283 are respectively connected to the conductive pads 531, 532 and 533 at the same die package 500'.

In some embodiments, the conductive pad 531 can be connected to an electric element (not shown in FIG. 4 for the purpose of simple description) on the die package 500'.

In this embodiment, the conductive pad 532 is electrically connected to the conductive pad 534, which is also connected to the conductive pad 630 on the die package 600 through a bonding wire 680, so that the die package 600 is electrically connected to the conductive stair structure 200d through the die package 500'.

In FIG. 4, the conductive pad 533 is connected to the conductive bump 271 through the bonding wire 281 and connected to the conductive pad 430 through the bonding wire 480, so that the die package 400 is also connected to the conductive stair structure 200d through the die package 500'.

Reference is made by FIGS. 5-18. FIGS. 5-18 illustrates schematic cross-section views in different operations of a method of manufacturing an integrated circuit structure with a conductive stair structure according to one embodiment of the present disclosure.

Figure 5:
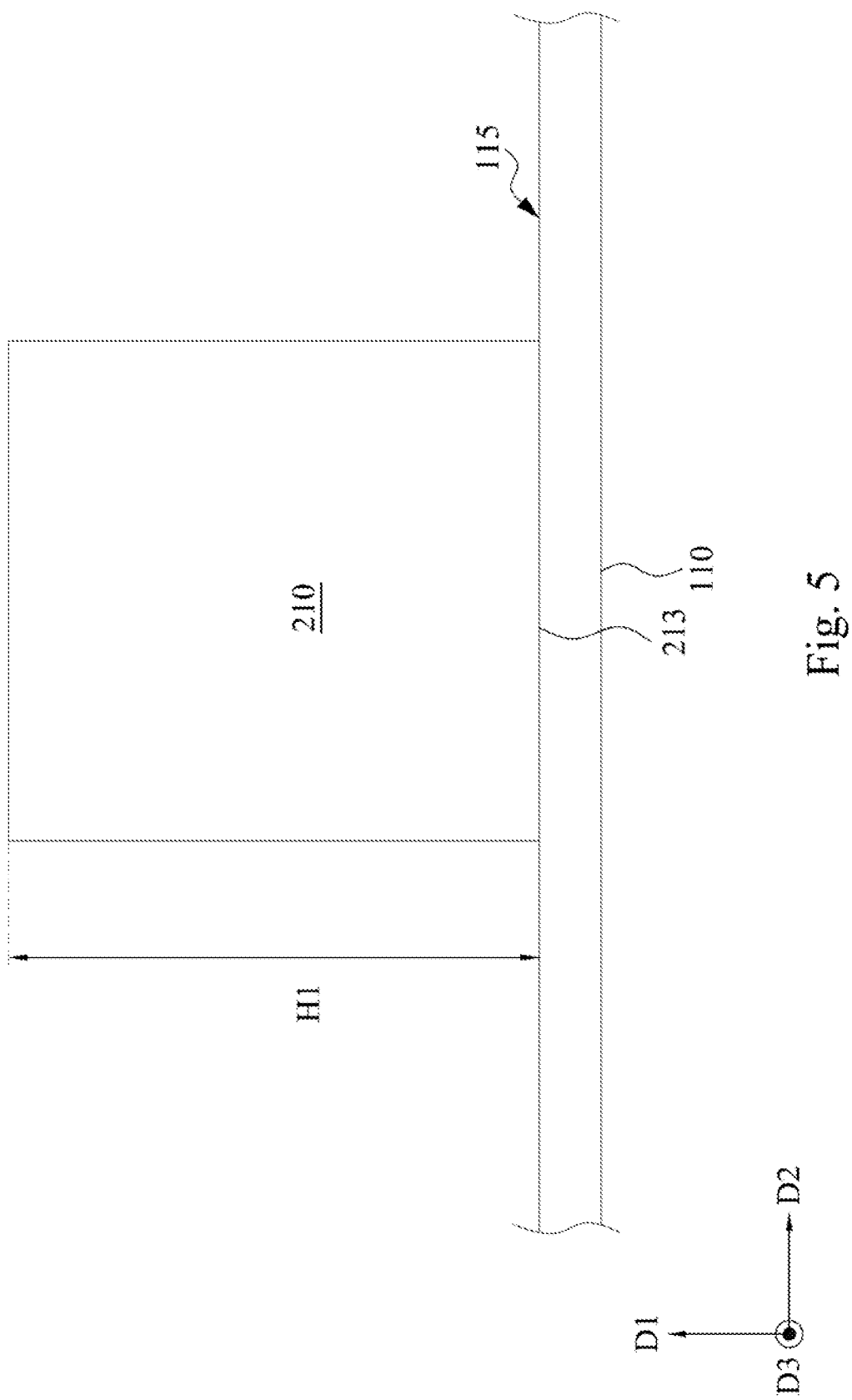
FIGS. 5-18 illustrates schematic cross-section views in different operations of a method of manufacturing an integrated circuit package structure with a conductive stair structure according to one embodiment of the present disclosure.

In FIG. 5, a rectangle conductive material 210 is provided on an upper surface 115 of the circuit board 110. In some embodiments, one or more electric elements (not shown in FIG. 5) are also located at the circuit board 110, and a pin of one electric element is electrically connected to the conductive material 210. The conductive material 210 has a height H1 along the first direction D1.

Figure 6:
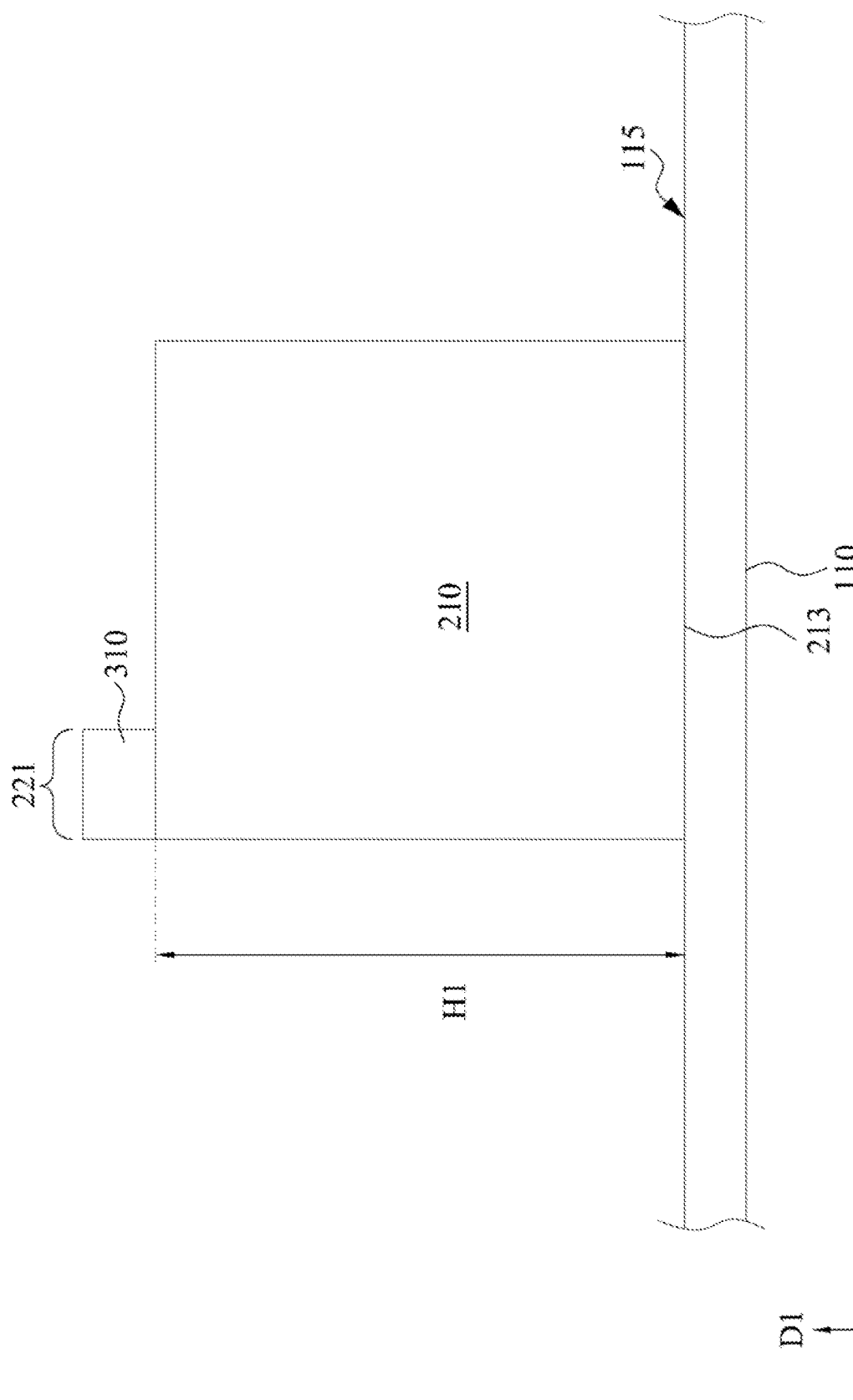

Proceed to FIG. 6. In FIG. 6, a photo-resist layer 310 is formed on the conductive material 210. A portion of the conductive material 210 covered by the photo-resist layer 310 is defined as a first portion 221 of the conductive material 210.

Figure 7:
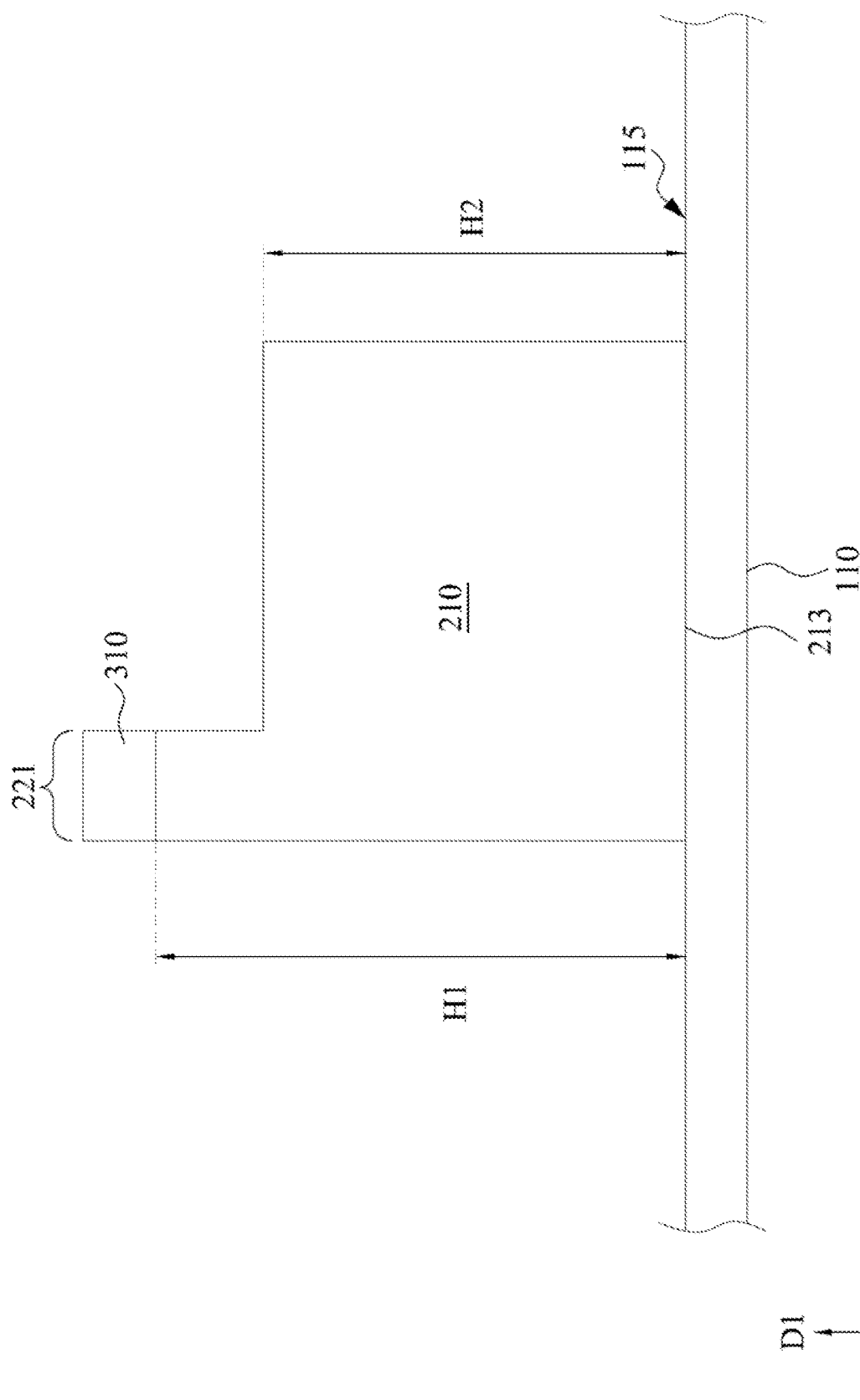

In FIG. 7, the conductive material 210 beyond the first portion 221 covered by the photo-resist layer 310 is recessed, so that a height of the conductive material 210 beyond first portion 221 is decreased to a height H2. In this embodiment, the conductive material 210 beyond the first portion 221 covered by the photo-resist layer 310 is recessed by a photolithography process. Therefore, the first portion 221 covered by the photo-resist layer 310 has a step-shaped, and the first portion 221 can be regarded as one of the steps after the photo-resist layer 310 is removed in the following operations.

Figure 8:
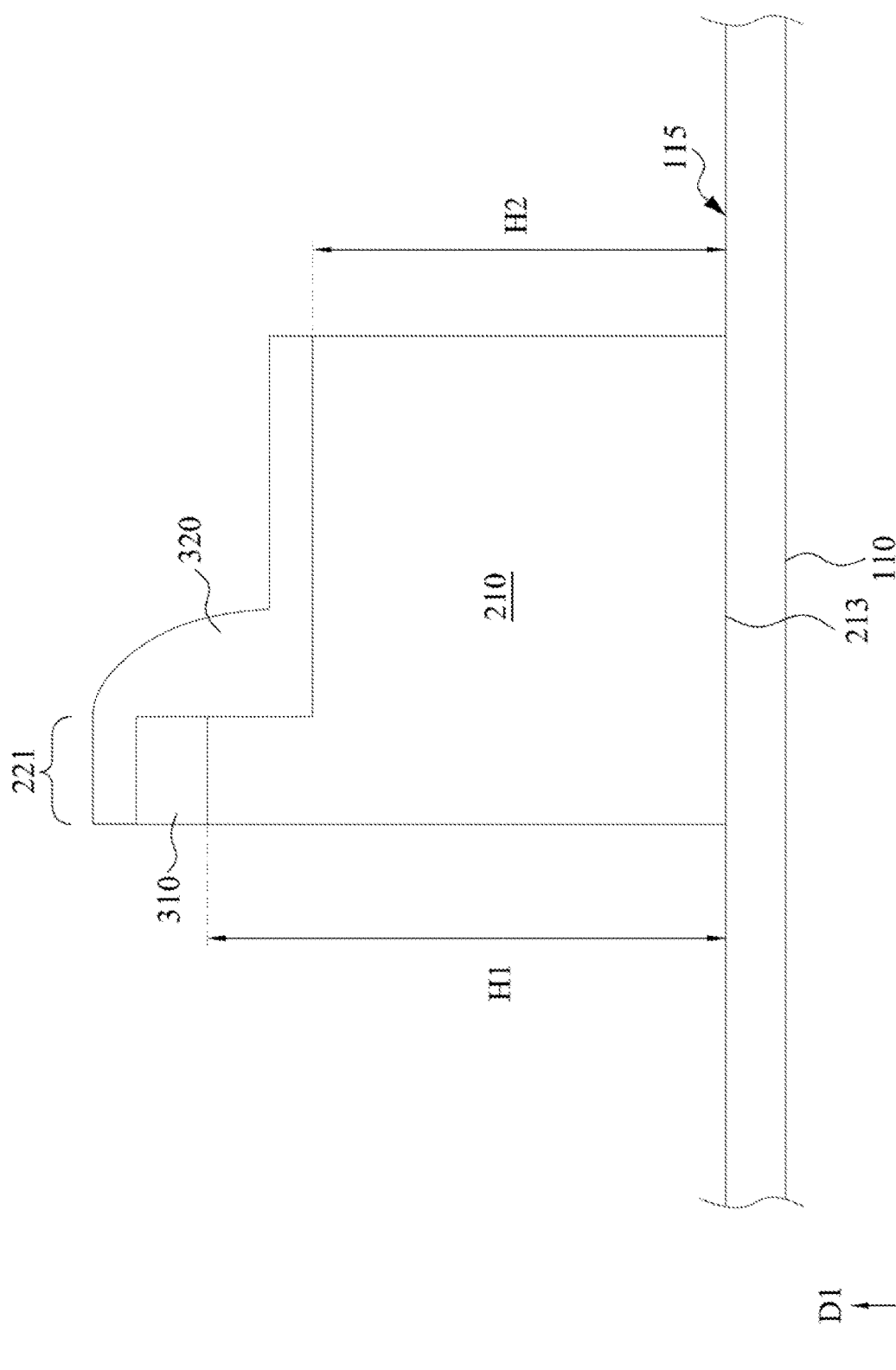
Figure 9:
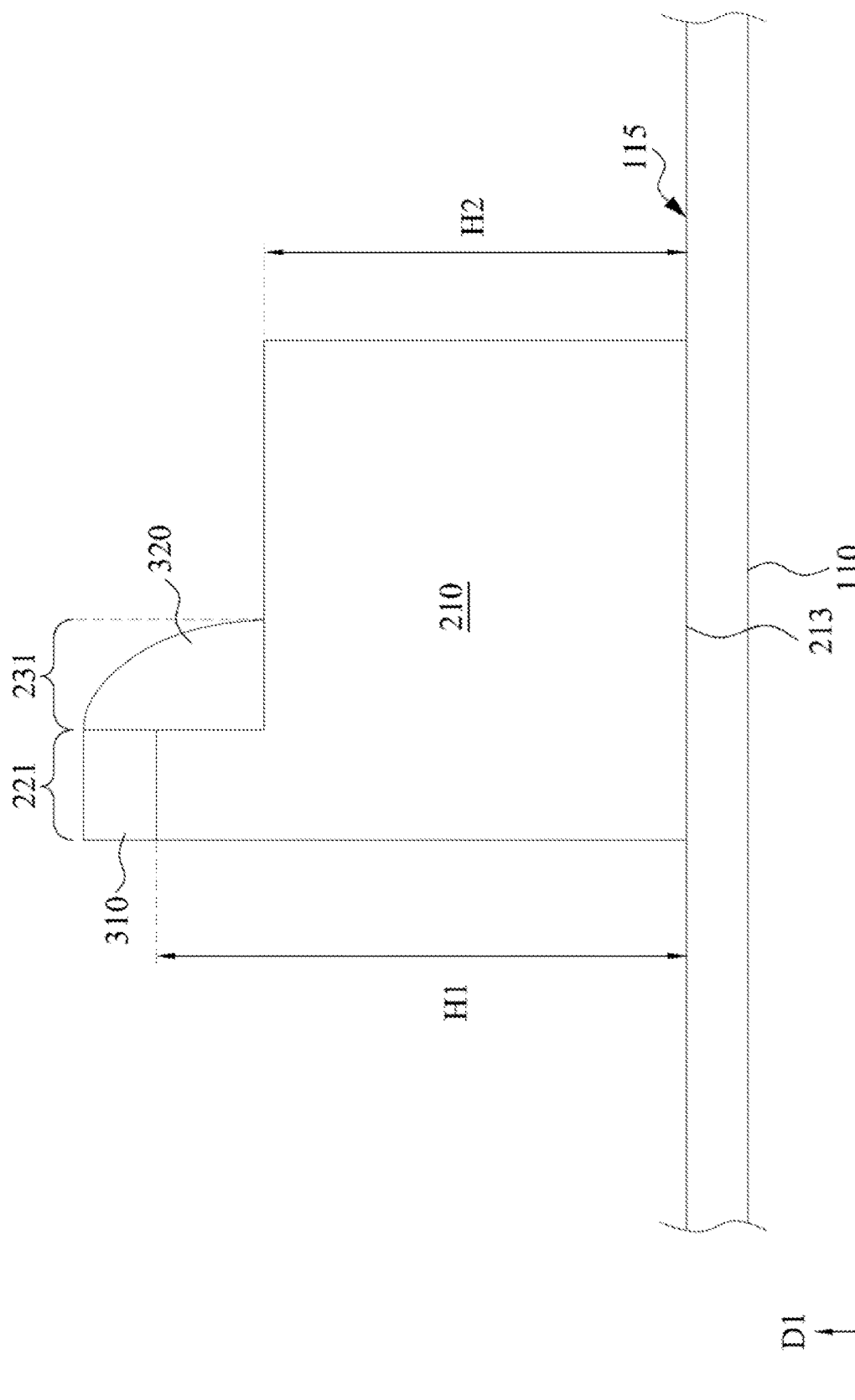

In FIG. 8, before the photo-resist layer 310 is removed, a first spacer layer 320 is further formed on the conductive material 210 beyond the first portion 221 and the photo-resist layer 310. Then, in FIG. 9, some of the first spacer layer 320 is removed to expose the conductive material 210 to be recessed. In some embodiments, some of the first spacer layer 320 is etched and removed. In this embodiment, the thickness of the first spacer layer 320 along the first direction D1 is reduced conformally in different position along the second direction D2. A portion of the conductive material 210 beyond the first portion 221 and still covered by the remained first spacer layer 320 is defined as a second portion 231.

Figure 10:
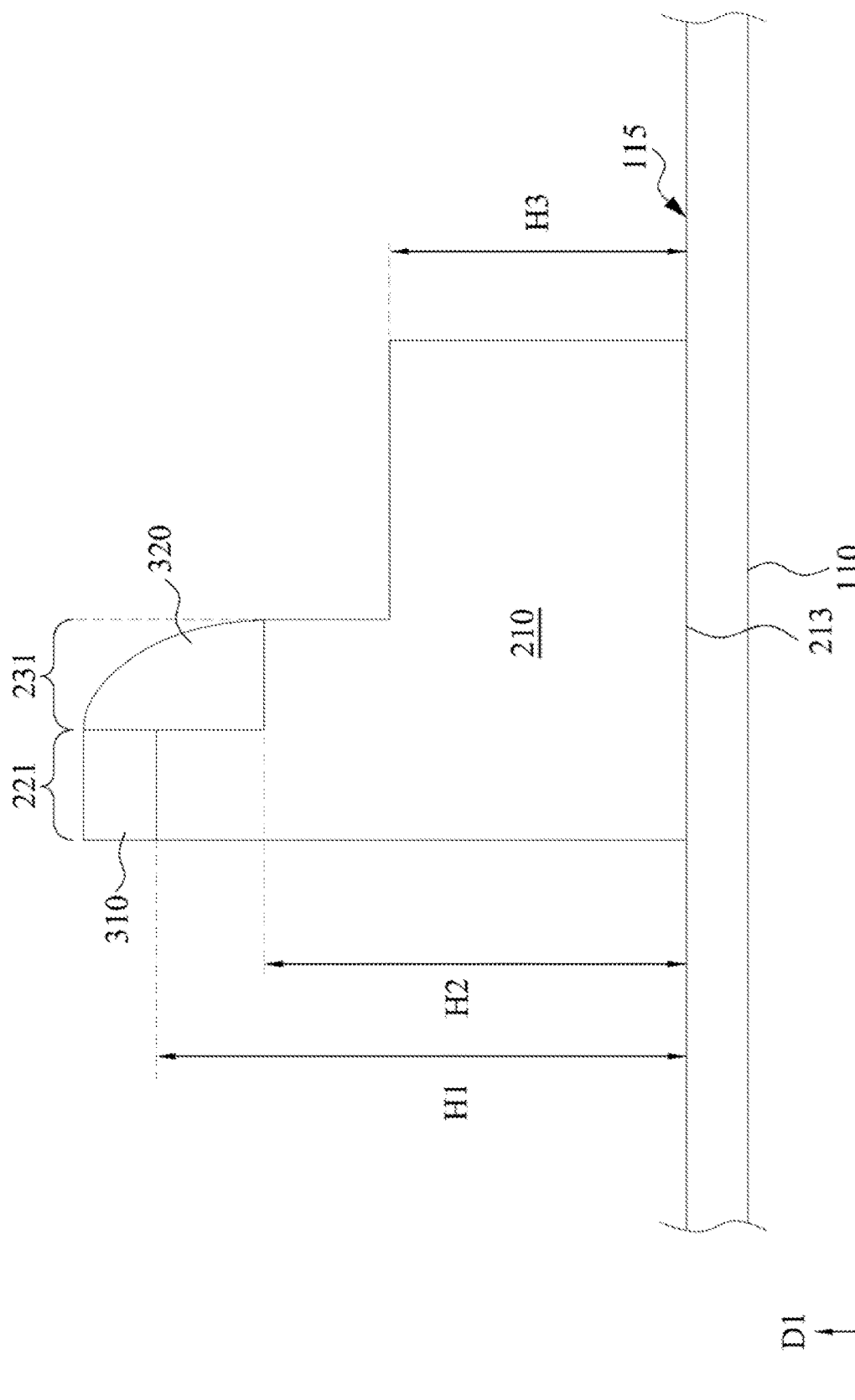

Proceed to FIG. 10, the conductive material 210 beyond the first portion 221 and the second portion 231 is further recessed. In some embodiments, recessing of the conductive material 210 beyond the first portion 221 and the second portion 231 is performed according the first spacer layer 320 by an anisotropic etching process. A height of the conductive material 210 beyond the first portion 221 and the second portion 231 is further decreased to a height H3.

After the conductive material 210 beyond the first portion 221 and the second portion 231 is recessed, the second portion 231 also has a step-shaped. The second portion 231 can be regarded as one of the steps after the photo-resist layer 310 and the first spacer layer 320 are removed in the following operations.

Figure 11:
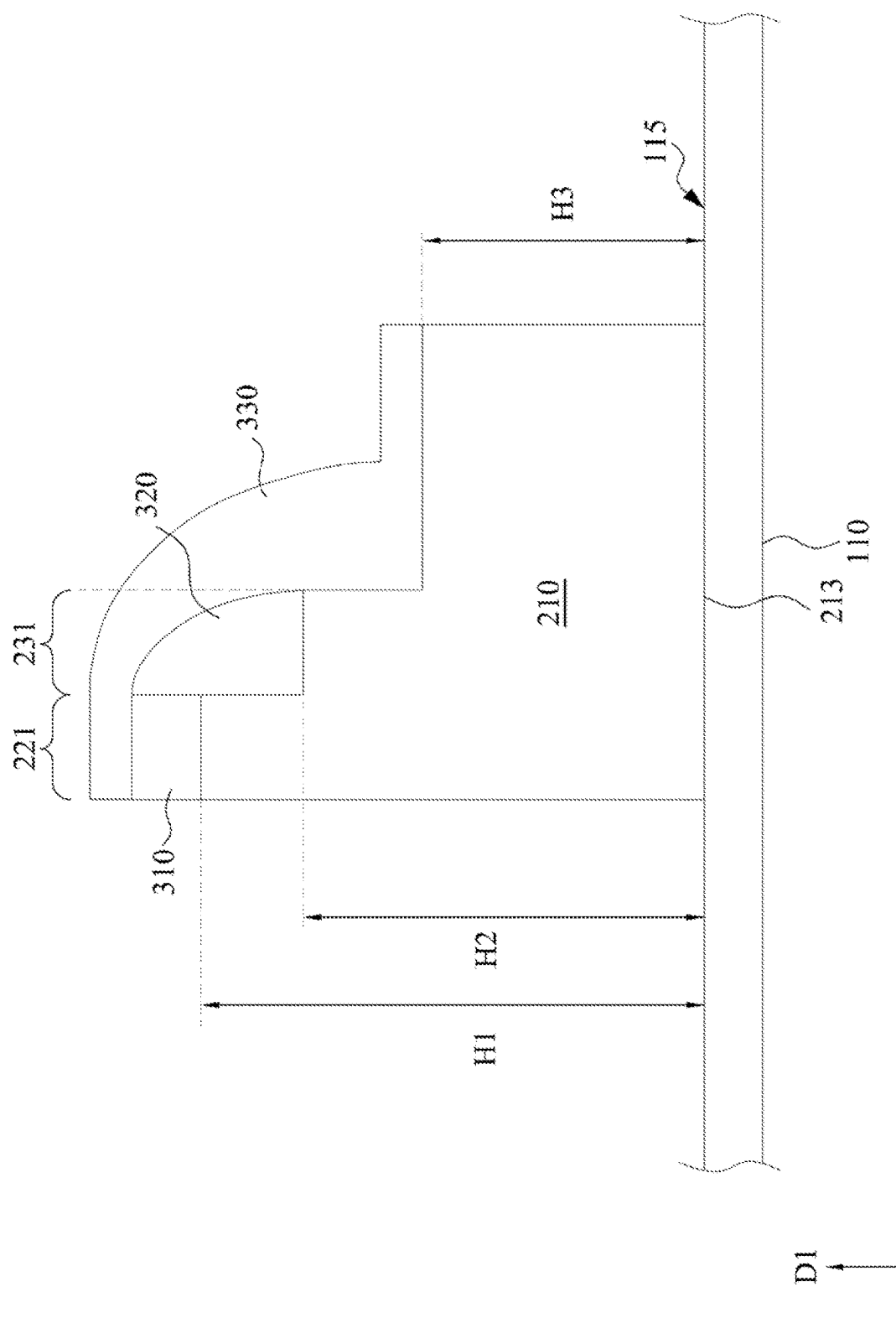
Figure 12:
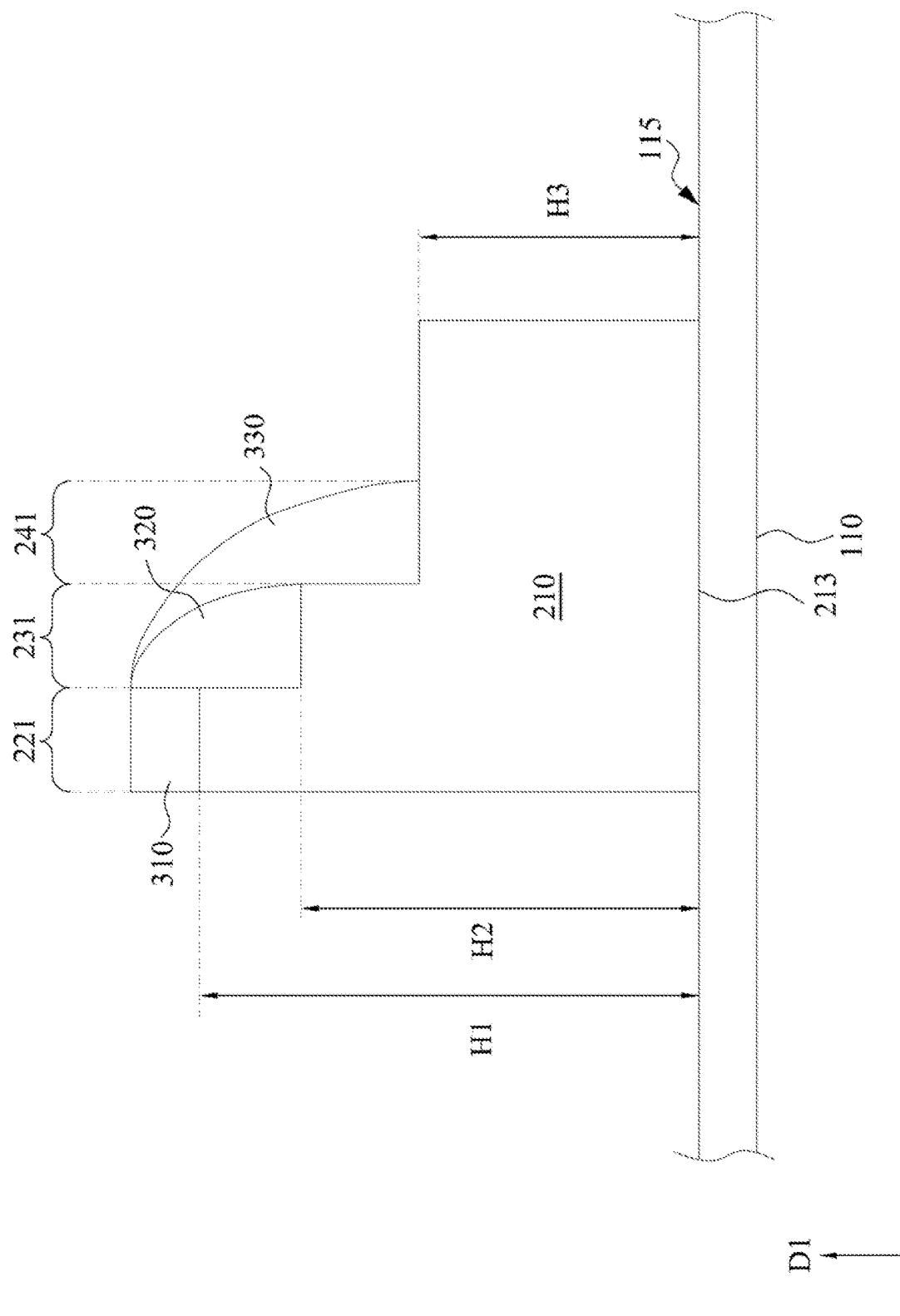

In FIG. 11, a second spacer layer 330 is formed on the conductive material 210. The conductive material 210 beyond the first portion 221 and the second portion 231, the first spacer layer 320 and the photo-resist layer 310 are further coved by the second spacer layer 330. Then, in FIG. 12, some of the second spacer layer 330 is removed to expose the conductive material 210 to be recessed. In some embodiments, some of the second spacer layer 330 is etched and removed. In this embodiment, the thickness of the second spacer layer 330 along the first direction D1 is also reduced conformably in different position along the second direction D2. A portion of the conductive material 210 beyond the first portion 221 and the second portion 231 and still covered by the remained second spacer layer 330 is defined as a third portion 241.

Figure 13:
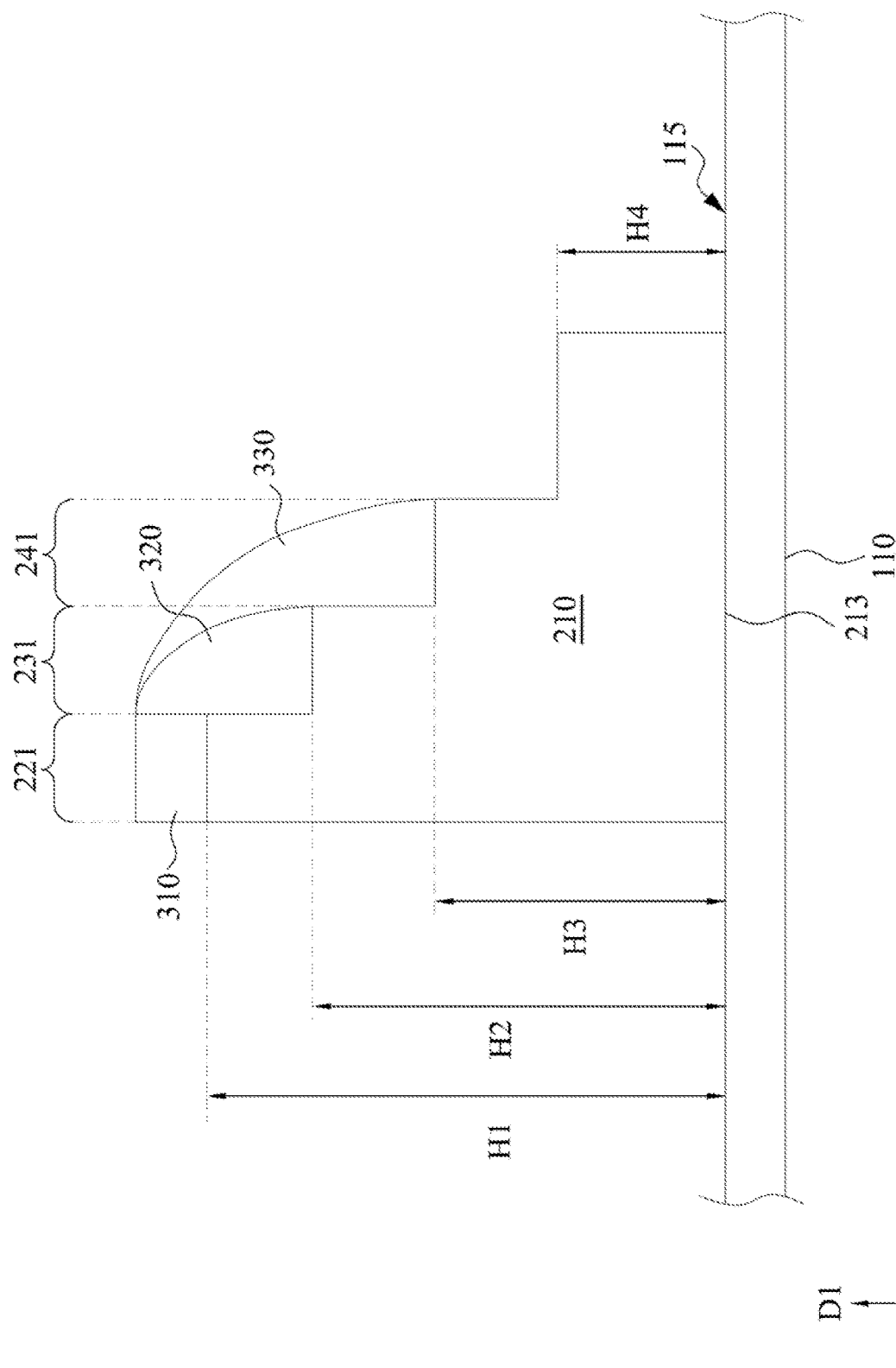

Proceed to FIG. 13. In FIG. 13, the conductive material 210 beyond the first portion 221, the second portion 231 and the third portion 241 is further recessed. Similarly, in some embodiments, recessing of the conductive material 210 beyond the first portion 221, the second portion 231 and the third portion 241 can be performed according the second spacer layer 330 by an anisotropic etching process. A height of the conductive material 210 beyond t the first portion 221, the second portion 231 and the third portion 241 is further decreased to a height H4.

Figure 14:
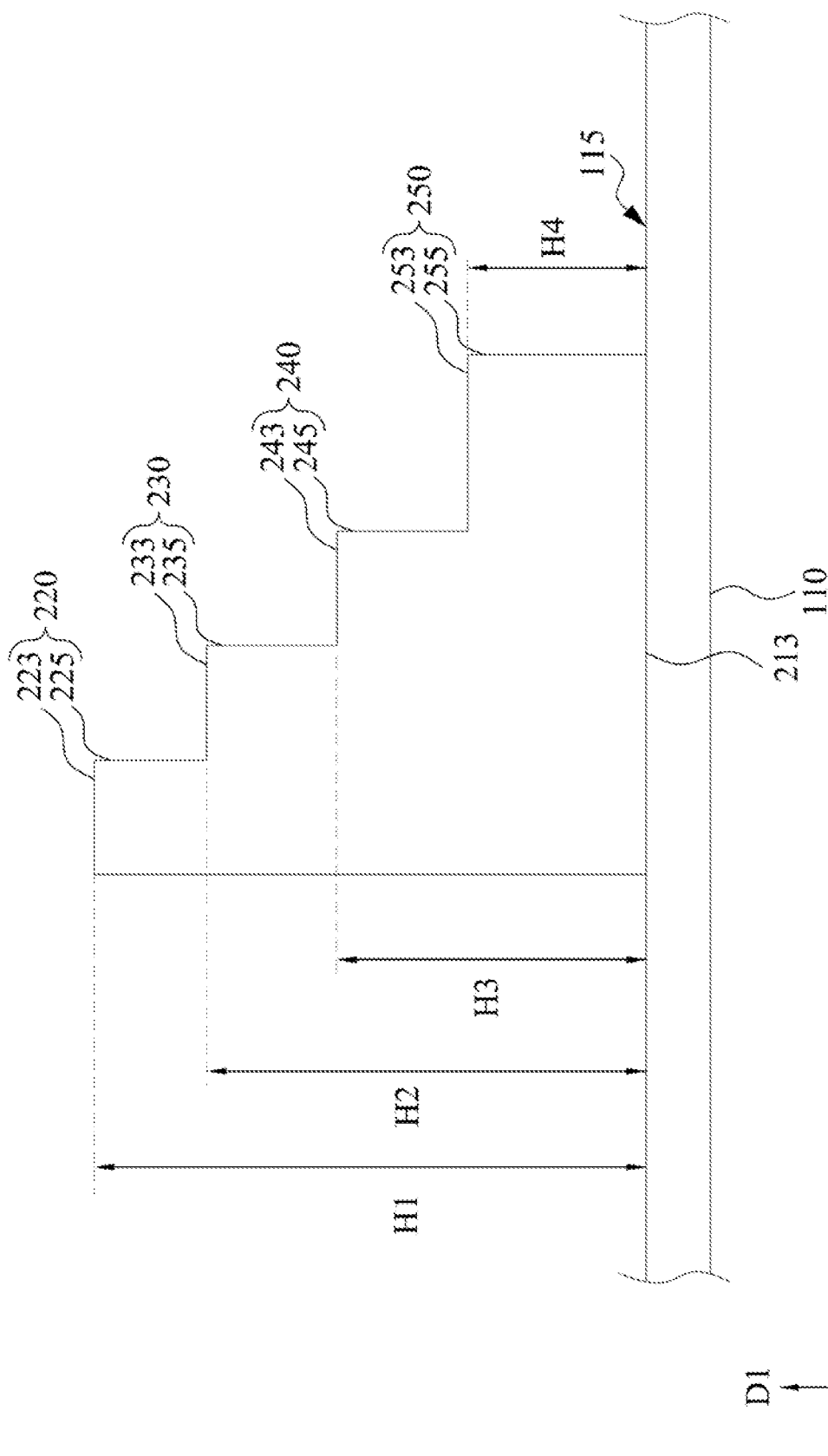

In FIG. 14, the photo-resist layer 310, the first spacer layer 320 and the second spacer layer 330 are all removed from the conductive material 210, and the first portion 221, the second portion 231 and the third portion 241 are all exposed and defined as steps 220, 230 and 240, respectively.

Each of the steps 220, 230 and 240 has a plane the second direction D2 and a sidewall along the first direction D1. As shown in FIG. 14, the step 220 has a plane 223 along the second direction D2 and a sidewall 225 along the first direction D1. The sidewall 225 abuts the plane 223 to have a right angle. Similarly, the step 230 has a plane 233 and a sidewall 235, and the step 240 has a plane 243 and a sidewall 245. Furthermore, the plane 253 along the second direction D2 and the sidewall 255 can define a step 250.

For steps 220, 230, 240 and 250, the plane 223 of the step 220 has a height H1 from the bottom 213 of the conductive material 210. The plane 233 of the step 230 has a height H2 from the bottom 213 of the conductive material 210. The plane 243 of the step 240 has a height H3 from the bottom 213 of the conductive material 210. The plane 233 of the step 230 has a height H4 from the bottom 213 of the conductive material 210. Therefore, the step 220 is the highest one of the steps 220, 230, 240 and 250 along the first direction D1.

In some embodiments, the steps 220, 230, 240 and 250 can define a conductive stair structure. Reference is made by FIGS. 2A and 2B, some conductive bumps or bonding wires can be directly formed on the planes 223, 233, 243 and 253 of the steps 220, 230, 240 and 250.

Figure 15:
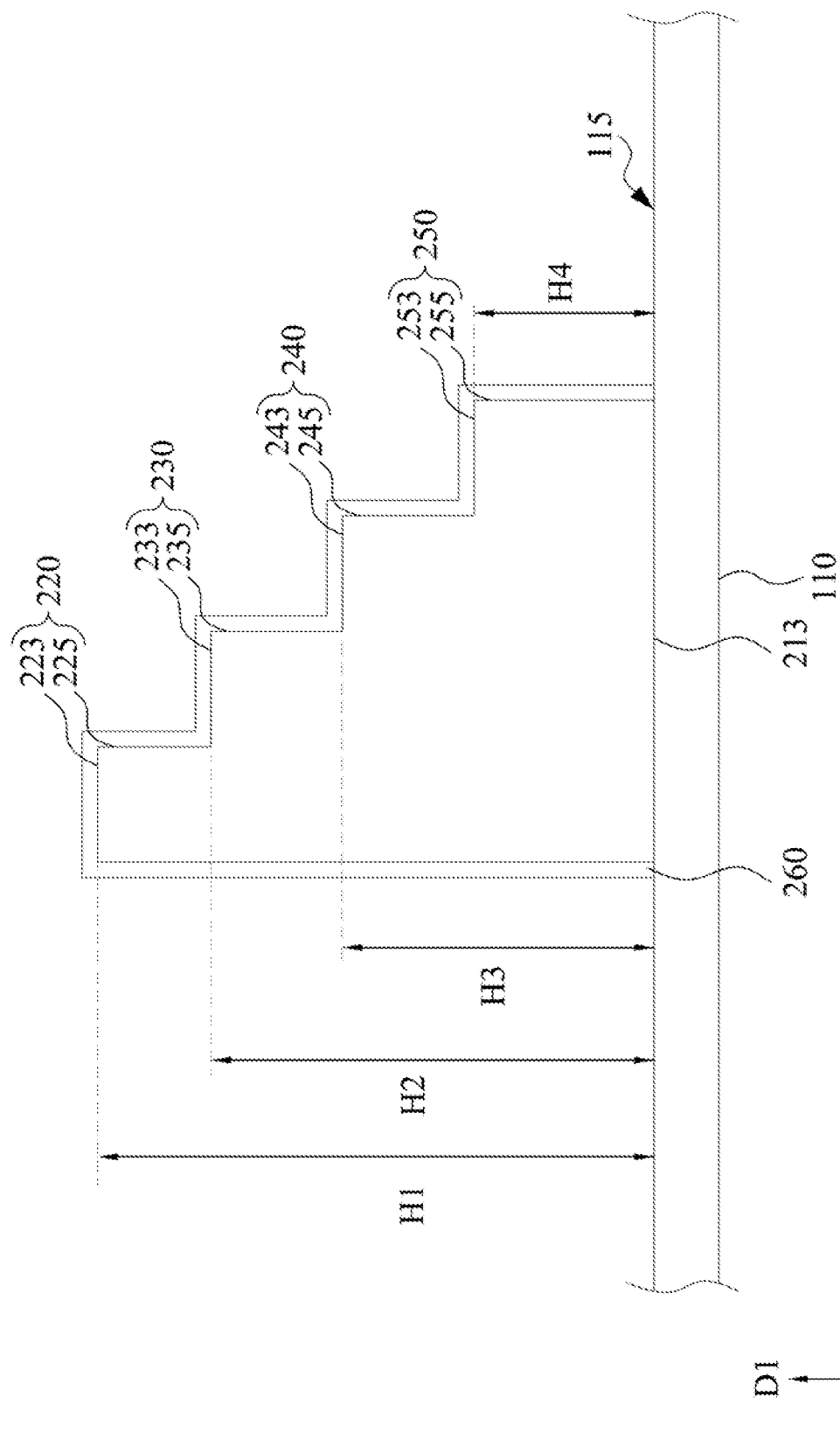

Proceed to FIG. 15, a seed layer 260 is formed on the conductive material 210 and covers the steps 220, 230, 240 and 250. The seed layer 260 is used to form conductive bumps and/or bonding wires on the steps 220, 230, 240 and 250 easily. As shown in FIG. 15, the seed layer 260 is extended to the upper surface 115 of the circuit board 110. In some embodiments, the seed layer 260 is formed on the conductive material 210 through a deposited process. In some embodiments, material of the seed layer 260 is metal.

Figure 16:
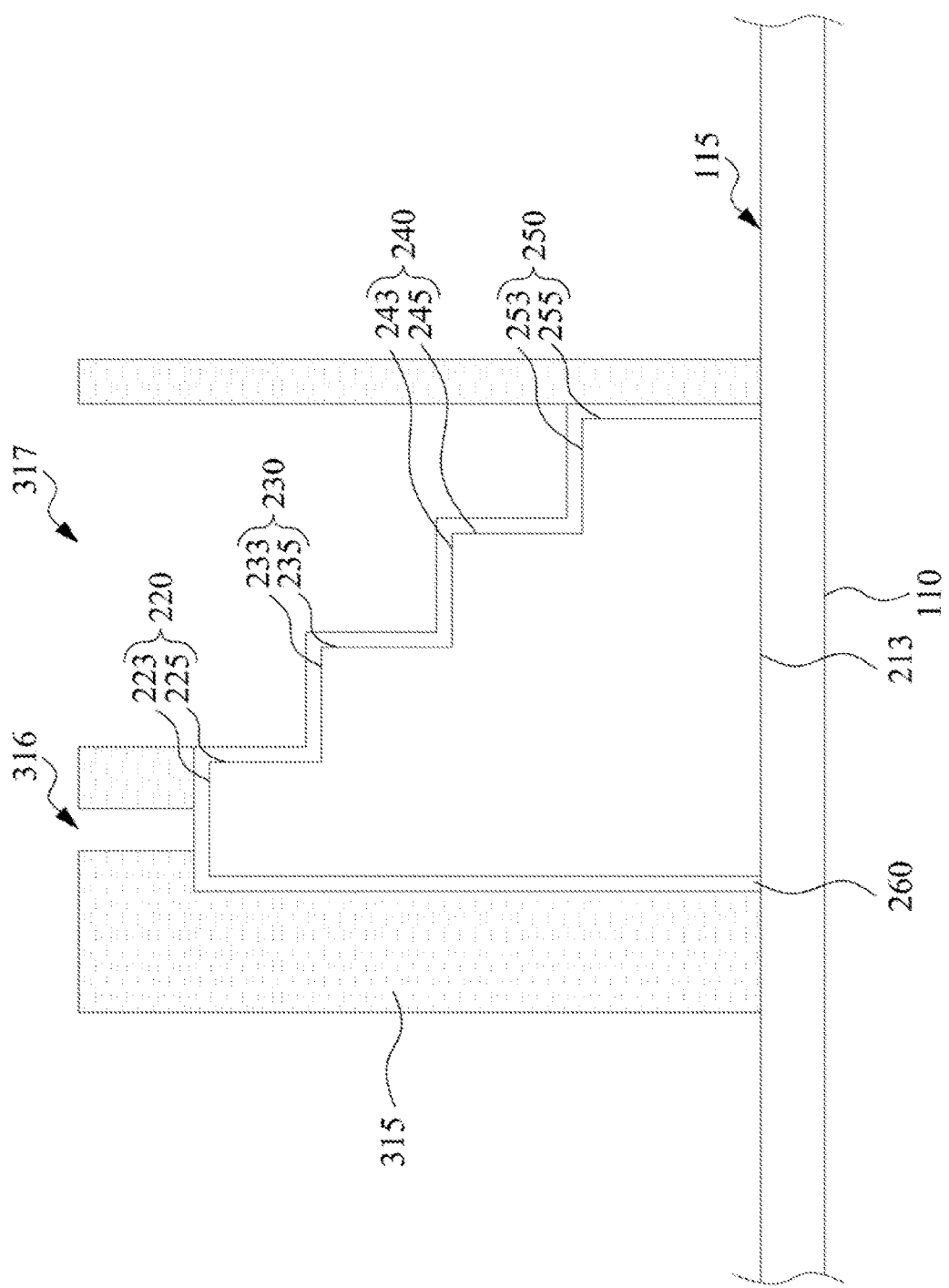

In FIG. 16, a masking layer 315 is further formed on the seed layer 260. In this embodiment, the masking layer 315 is patterned to have openings 316 and 317. The opening 316 is used as a model to form a conductive rod on the plane 223 of the highest step 220, and the opening 316 is aligned with the plane 223 of the step 220, which is defined from the first portion 221. The plane 233 of the step 230, the plane 243 of the step 240 and the plane 253 of the step 250 are exposed from the opening 317. Then, buffer connectors can be formed on the planes 233, 243 and 253 exposed from the opening 317 through the seed layer 260.

Figure 17:
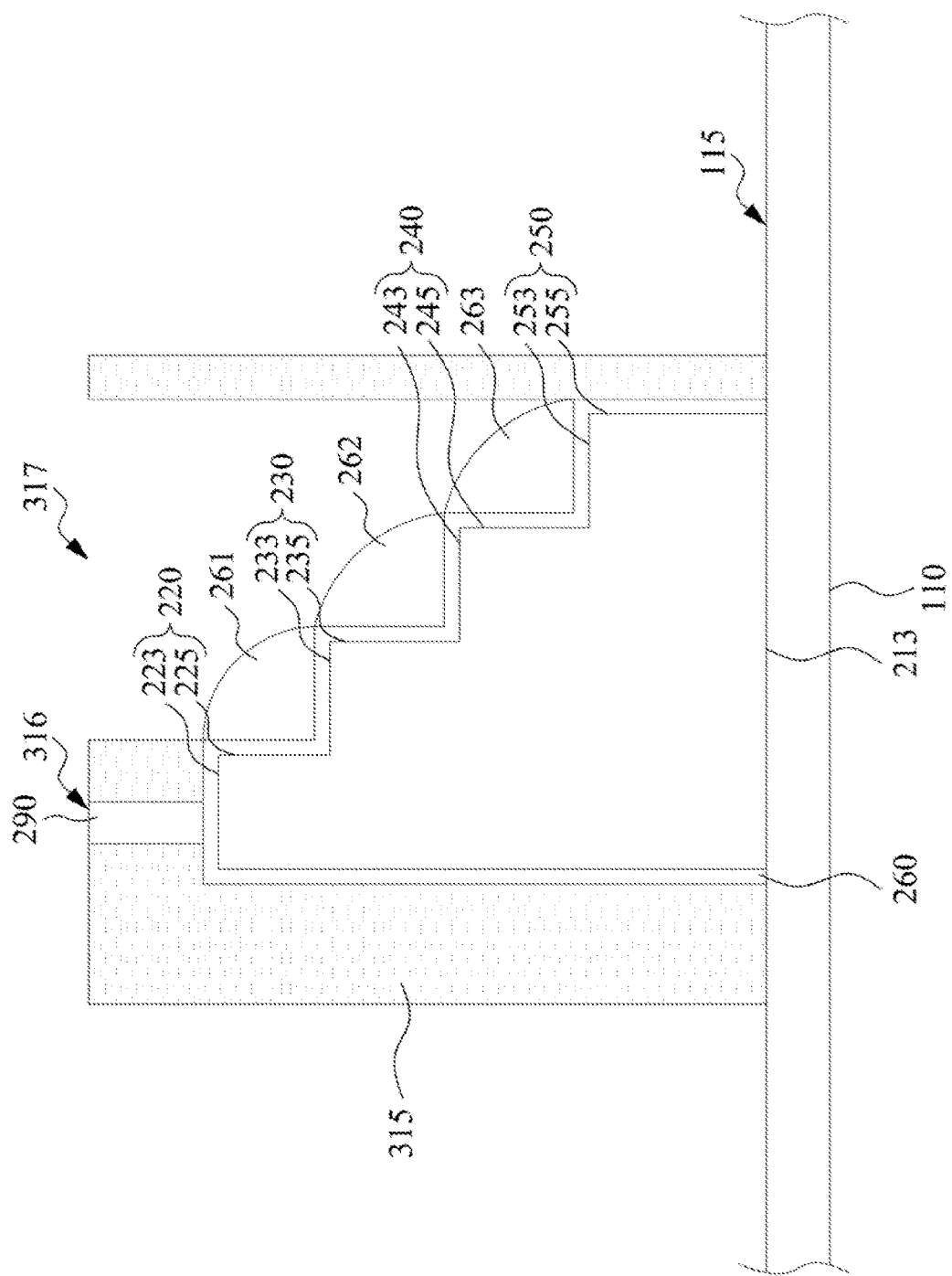

Proceed to FIG. 17, the buffer connector 261, 262 and 263 are respectively formed on the planes 233, 243 and 253. In some embodiments, the buffer connector 261, 262 and 263 are respectively formed on the planes 233, 243 and 253 through a deposited process. In this embodiment, the buffer connectors 261, 262 and 263 are with cylindrical surfaces. Furthermore, the conductive rod 290 is formed with the opening 316.

Figure 18:
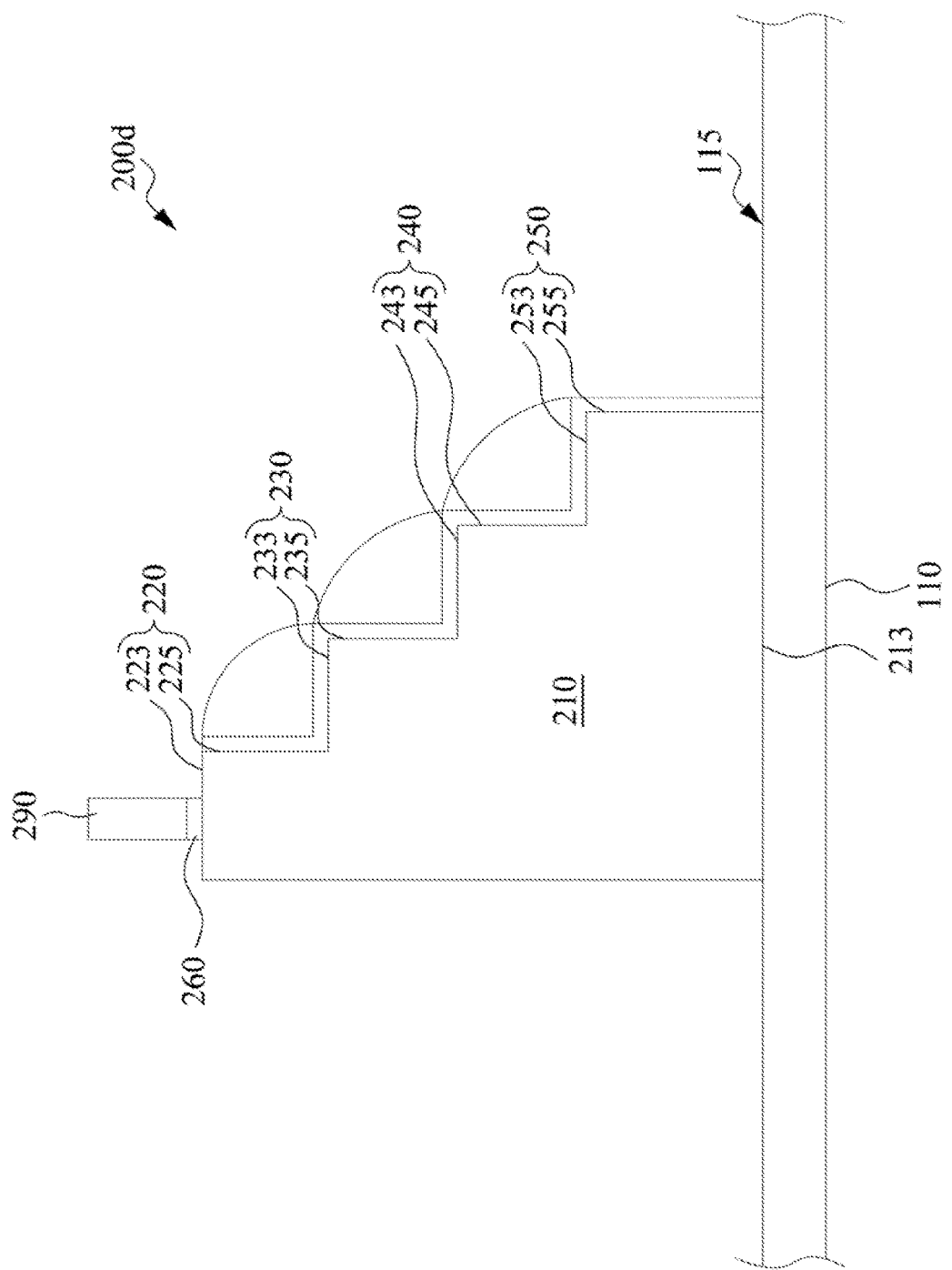

In FIG. 18, the masking layer 315 is removed. In this embodiment, the exposed seed layer 260 is also removed, so that the plane 223 of the step 220 is exposed. Therefore, an integrated circuit structure with a conductive stair structure 200d is formed. The buffer connectors 261, 262 and 263 can be connected to bonding wires extended from other die packages. The conductive rod 290 can be directly connected to a die package upon the conductive stair structure 200d.

In this embodiment, one conductive stair structure 200d is formed on the circuit board 110 of the integrated circuit structure 100. In addition, the formed conductive stair structure 200f includes the steps 220, 230, 240 and 250 being integrally formed. In some embodiments, more conductive stair structures can be formed on the circuit board 110 at the same time.

In summary, a conductive stair structure on the integrated circuit structure can have a greater area, which is used to be connected bonding wire, than the conductive pad, so that two or more bonding wires can be connected the conductive stair structure at different heights simultaneously. Therefore, the area occupied by bonding on the integrated circuit structure can be reduced.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. An integrated circuit package structure, comprising:
   a circuit board;
   a conductive stair structure on the circuit board, wherein the conductive stair structure comprises a plurality of step portions located at different heights relative to a top surface of the circuit board, and the step portions are formed of a same conductive material;
   a plurality of die structures; and
   a plurality of bonding wires respectively connecting the die structures to the step portions of the conductive stair structure.

2. The integrated circuit package structure of claim 1, further comprising:
   a seed layer covering the step portions of the conductive stair structure; and
   a buffer connector formed on the seed layer and between two immediately-adjacent ones of the step portions.

3. The integrated circuit package structure of claim 1, wherein each of the step portions of the conductive stair structure comprises:
   a plane extending in a horizontal direction parallel to the top surface of the circuit board; and
   a sidewall vertically abutting the plane.

4. The integrated circuit package structure of claim 1, wherein the bonding wires are in direct contact with the step portions, respectively.

5. The integrated circuit package structure of claim 1, further comprising:
   a plurality of conductive bumps in contact with the bonding wires, respectively.

6. The integrated circuit package structure of claim 5, further comprising:
   a seed layer covering the step portions of the conductive stair structure; and
   a plurality of buffer connectors formed on the seed layer, wherein the conductive bumps are on the buffer connectors, respectively.

7. The integrated circuit package structure of claim 6, wherein the conductive bumps are on sloped surfaces of the buffer connectors, respectively.

8. The integrated circuit package structure of claim 6, wherein the conductive bumps are on arc-shaped surfaces of the buffer connectors, respectively.

9. The integrated circuit package structure of claim 1, further comprising:
   a conductive rod located on a topmost surface of the conductive stair structure; and
   a conductive pad directly over the conductive rod.

10. The integrated circuit package structure of claim 9, further comprising:
    a first seed layer between the topmost surface of the conductive stair structure and the conductive rod.

11. The integrated circuit package structure of claim 10, further comprising:
    a second seed layer covering the step portions of the conductive stair structure, wherein the first and second seed layer are spaced apart from each other.

12. The integrated circuit package structure of claim 11, wherein a topmost surface of the second seed layer is level with the topmost surface of the conductive stair structure.

13. The integrated circuit package structure of claim 11, wherein a bottommost surface of the second seed layer is level with a bottom surface of the conductive stair structure.

14. An integrated circuit package structure, comprising:
    a circuit board;
    a conductive stair structure on the circuit board, wherein the conductive stair structure comprises a plurality of step portions formed of a same conductive material;
    a first seed layer over a topmost surface of the conductive stair structure;
    a conductive rod over the first seed layer;
    a second seed layer over the step portions of the conductive stair structure, wherein the first and second seed layer are spaced apart from each other; and
    a plurality of buffer connectors over the second seed layer.

15. The integrated circuit package structure of claim 14, further comprising:
    a plurality of conductive bumps over surfaces of the buffer connectors, respectively.

16. The integrated circuit package structure of claim 15, further comprising:
    a plurality of bonding wires respectively connected to the buffer connectors over by the conductive bumps.

17. The integrated circuit package structure of claim 14, wherein a topmost surface of the second seed layer is level with the topmost surface of the conductive stair structure.

18. An integrated circuit package structure, comprising:
    a circuit board;
    a conductive stair structure on the circuit board, an entirety of the conductive stair structure being formed of a same conductive material, wherein the conductive stair structure comprising a stepped sidewall extending from a bottom surface of the conductive stair structure to a top surface of the conductive stair structure, and a linear sidewall opposite to the stepped sidewall and extending from the bottom surface of the conductive stair structure to the top surface of the conductive stair structure;
    a seed layer over the stepped sidewall; and
    a plurality of buffer connectors over the seed layer, the buffer connectors being located at different heights relative to a top surface of the circuit board.

19. The integrated circuit package structure of claim 18, further comprising:
    a plurality of conductive bumps respectively over surfaces of the buffer connectors; and
    a plurality of bonding wires respectively connected to the buffer connectors over by the conductive bumps.

* * * * *